(12) United States Patent  
Shvartsman

(10) Patent No.: US 7,482,809 B1  
(45) Date of Patent: Jan. 27, 2009

(54) METHOD OF OPTIMIZED GRADIENT COIL DESIGN

(75) Inventor: Shmaryu Shvartsman, Highland Heights, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 0 days.

(21) Appl. No.: 11/779,445

(22) Filed: Jul. 18, 2007

(51) Int. Cl.  
*G01V 3/00* (2006.01)

(52) U.S. Cl. ........................................ 324/318; 324/322

(58) Field of Classification Search ................. 324/318, 324/322  
See application file for complete search history.

(56) References Cited

U.S. PATENT DOCUMENTS

| | | | |
|---|---|---|---|
| 4,646,024 A | 2/1987 | Schenck et al. | |
| 4,737,716 A | 4/1988 | Roemer et al. | |
| 4,794,338 A | 12/1988 | Roemer et al. | |
| 4,840,700 A | 6/1989 | Edelstein et al. | |
| 4,978,920 A | 12/1990 | Mansfield et al. | |
| 5,296,810 A * | 3/1994 | Morich .......................... | 324/318 |
| 6,278,276 B1 * | 8/2001 | Morich et al. ................ | 324/318 |
| 6,377,148 B1 * | 4/2002 | Forbes et al. ................. | 335/301 |
| 6,456,076 B1 * | 9/2002 | Joseph .......................... | 324/318 |
| 6,462,547 B1 * | 10/2002 | Heid et al. .................... | 324/318 |

OTHER PUBLICATIONS

Journal of Magnetic Resonance (66, 573-576) Active Magnetic of Gradient Coils in NMR Imaging P. Mansfield and B Chapman 1986.  
Magnetic Resonance in Medicine (17, 15-21) Gradient Coil Design Using Active Magnetic Screening R. Bowtell and P. Mansfield 1991.  
Magnetic Resonance Imaging, vol. 11, pp. 903-920 Gradient Coil Design: A Review of Methods Robert Turner 1993.

* cited by examiner

*Primary Examiner*—Louis M Arana  
(74) *Attorney, Agent, or Firm*—Ulmer and Berne LLP

(57) ABSTRACT

The present invention relates to a method of discretization of the continuous current solution of a gradient coil design that allows satisfaction of the target field quality characteristics as well as other characteristics such as minimization of the energy/inductance, minimization of the residual eddy current effect, minimization of the thrust forces on the coil and cold shields, coil resistance thus the power dissipated by the coil, etc. The method of optimized gradient coil design can be applied to the design of axial or transverse gradient coils. The method of this invention includes the steps of defining at least one, and more commonly numerous performance characteristics of the desired gradient coil, concurrently varying discretization parameters to develop numerous possible hypothetical gradient coil designs, evaluating the designs to determine whether the defined performance characteristics are met by each design and selecting one design.

6 Claims, 20 Drawing Sheets

METHOD OF OPTIMIZED GRADIENT COIL DESIGN

TECHNICAL FIELD

The invention relates to a new method of gradient coil design for use in magnetic resonance imaging (MRI) for spatial encoding of the MRI signal. The invention more specifically relates to a new method of optimized gradient coil design for both transverse and axial gradient coil.

BACKGROUND OF THE INVENTION

Magnetic resonance imaging (MRI) is a medical diagnostic imaging technique used to diagnose many types of medical conditions. An MRI system includes a main magnet for generating a main magnetic field through an examination region. The main magnet is arranged such that its geometry defines the examination region. The main magnetic field causes the magnetic moments of a small majority of the various nuclei within the body to be aligned in a parallel or anti-parallel arrangement. The aligned magnetic moments rotate around the equilibrium axis with a frequency that is characteristic for the nuclei to be imaged. An external radiofrequency (RF) field applied by other hardware within the MRI system perturbs the magnetization from its equilibrium state. Upon termination of the application of the RF pulse, the magnetization relaxes to its initial state. During relaxation the time varying magnetic moment induces a detectable time varying voltage in the receive coil. The time varying voltage can be detected by the receive mode of the transmit coil itself, or by an independent receive only coil.

MRI systems are made of many hardware components that work in conjunction with specialized software to produce the final images FIG. 1 illustrates an MRI system with the front cover removed so the main hardware components can be seen. Magnet 12 is the main hardware component of MRI system 10 and is responsible for producing the uniform main magnetic field, $B_0$. Magnets used in MRI systems can produce either a horizontal or a vertical magnetic field.

Within the volume defined by main magnet 12 there is at least one gradient coil 14. Gradient coils 14 produces substantially linear spatially varying magnetic fields within the imaging volume that are coincidental with the direction of the main magnetic field but vary along the three orthogonal directions (x, y, z) of the Cartesian coordinate system. Initially, gradient coils included only single primary gradient coil unit 18, however, the presence of spurious and spatially dependent eddy currents on the magnet's Dewar structure necessitated the need to shield the gradient magnetic field at the magnet's vicinity. Secondary shielding gradient coil 20 is added to the primary gradient coil's structure with a required minimum gap between the primary and secondary gradient coil structures.

Self-shielded gradient coils of prior art are usually designed using the following general steps:
1. The shield coil is assumed to be much longer than the primary coil;
2. The continuous current densities on both the primary and shield coil are derived to deliver the desired field quality characteristics of the gradient coil;
3. The continuous current density on the shield coil is truncated to match the desired length of the system;
4. The continuous current densities are discretized using the standard techniques, described below; and
5. The discretized solution is verified to ensure the solution satisfies the required characteristics.

One of the problems in past methods of gradient coil design is the discretization procedure that approximates the continuous current densities by a number of current carrying conductors (step 4 of the above method). The shape of the current carrying conductors determines the electromagnetic properties of the gradient coil. These include the gradient field strength, field quality characteristics inside the Field-of-View (FoV), linearity and uniformity along the principal axis and orthogonal axes respectively, leakage of the magnetic field into the region where eddy currents might be induced, coil resistance, slew rate, etc. The output of the discretization procedure determines the positions of the current carrying conductors and their minimum widths, which govern the coil resistance, thus the power dissipated by the coil and the possible slew rate. For a self-shielded gradient coil the level of the eddy currents is sensitive to discretization procedure When designing the gradient coil it is also important to be able to minimize the net thrust Lorentz force exerted on the coil due to the presence of the main magnet field. This force is sensitive to the position of the current carrying conductors, especially near the end of the coil.

The common practice of previous gradient coil designs is to derive the continuous current densities that provide the desired characteristics of the gradient coil. It is sometimes difficult to find a continuous solution that satisfies the field quality characteristics within the FoV and where the net thrust force is nullified by constraint. Depending on the magnet configuration the nullification of the thrust force can lead to an energy penalty or even to reversed current patterns on either the primary coil or the shield coil, which in fact leads to the energy/inductance penalty.

Another problem that arises in previous methods of gradient coil design is that eddy currents are induced in the worm bore or the cold shield of the magnet. Eddy currents in the cold shield result in distortions of the images. Because of the proximity of the cold shield to the magnet's coils the forces on the cold shield could be significant. These significant forces on the cold shield may lead to the vibration of the cold shield and even quenching of the magnet.

In previous gradient coil design methods the continuous current solution that satisfies the field quality characteristics within the FoV is obtained using either minimum inductance or target field method of Turner. In the design of an axial gradient coil, the continuous current densities and available power supply determine the minimum number of turns on both the primary and shield coil according to the method of Turner:

$$\int_0^{L_P} f_\varphi^{(P)}(z)dz = N_P I_P, \quad \int_0^{L_S} f_\varphi^{(S)}(z)dz = -N_S I_S \qquad \text{(Equation 1)}$$

In this two-part equation, where the first portion of the Equation deals with the primary coil and the second portion deals with the shield coil, $f_\varphi^{(P,S)}(z)$ is the $\varphi$-components of the continuous current density on primary coil (P) and shield coil (S), $L_{P,S}$ is the half-length of the primary/shield coil, $N_{P,S}$, $I_{P,S}$ are the number of turns and the current on half of the primary/shield coil and the current in the primary/shield, respectively. Ideally the currents on the primary and the shield coil should be equal to each other. In practice the latter is difficult to achieve ($I_P \neq I_S$) because of the free parameters in the problem: the geometry of the coil is determined by the space available and usually is at premium.

The positions of the current centroids (commonly called hoops) $Z_{n,m}^{(P,S)}$ are usually determined by the integrated current density according to the following equation $$\int_0^{Z_n^{(P)}} f_\varphi^{(P)}(z)\,dz - (n - 0.5)I_P = 0,$$ (Equation 2)

$$\int_0^{Z_m^{(S)}} f_\varphi^{(S)}(z)\,dz + (m - 0.5)I_S = 0$$

Within Equation 2, n is an integer between 1 and the number of turns on the primary coil, and m is an integer between 1 and the number of turns on the secondary coil ($1 \leq n \leq N_P$, $1 \leq m \leq N_S$).

In designing a transverse gradient using previous methods, the current paths on the primary/shield coil are defined by the following equation:

$$\varphi = \Phi_n(z)$$ (Equation 3)

$$\Phi_n(z) = \arccos(S_n / f_z(z))$$

$$S_n = \frac{n - 0.5}{N} f_z(z_{eye})$$

Here $f_z(z)$ is the z-component of the continuous current density, $Z_{eye}$ is the so called eye-position of the coil where the $\phi$-component of the continuous current density is equal zero:

$$f_\varphi(z_{eye}) = 0 : f_z(z_{eye}) = \max_{z \in [0,L]} \{f_z(z)\},$$

N is the number of loops in one quadrant of the coil, and n is an integer: $1 \leq n \leq N$.

At $\phi=0$ Eq. (3) determines the positions of Z-intercepts: the positions where the current paths intercept the cardinal axis as it is shown in FIG. 2. In FIG. 2 N-initial and N-final Z-intercepts are shown. Information about a transverse gradient can be expressed through the Z-intercepts and the current paths.

SUMMARY OF THE INVENTION

The present invention relates to an improved method of discretization of the continuous current solution of a gradient coil design that allows satisfaction of the target field quality characteristics as well as other characteristics such as minimization of the energy/inductance, minimization of the residual eddy current effect, minimization of the thrust forces on the coil and cold shields, coil resistance thus the power dissipated by the coil, etc. The method of optimized gradient coil design can be applied to the design of axial or transverse gradient coils. The method of this invention includes the steps of defining at least one, and more commonly numerous performance characteristics of the desired gradient coil, concurrently varying discretization parameters to develop numerous possible hypothetical gradient coil designs, evaluating the designs to determine whether the defined performance characteristics are met by each design and selecting one design. The design selected will often be the design that offers the best design solution by meeting numerous, if not all of the defined performance characteristics.

The method of gradient coil design of this invention allows designing a genuinely finite length gradient coil where the truncation of the continuous current densities is not involved. The new discretization technique allows for a gradient coil to be designed while taking into account predetermined desired characteristics of the gradient coil, without compromising the field quality characteristics, residual eddy currents, balancing the forces exerted on the gradient coil and the cold shield of the magnet.

It is an object of this invention to provide a method of gradient coil design wherein the method allows satisfaction of the target field quality characteristics as well as other characteristics such as minimization of the energy/inductance, minimization of the residual eddy current effect, minimization of the thrust forces on the coil and cold shields, coil resistance thus the power dissipated by the coil, etc.

It is yet a further object of this invention to provide an improved method of gradient coil design that is applicable to the design of both axial and transverse gradient coils.

It is a further object of this invention to provide for gradient coils designed by use of the method of this invention.

These and other objects of the present invention will become more readily apparent from a reading of the following detailed description taken in conjunction with the accompanying drawings wherein like reference numerals indicate similar parts, and with further reference to the appended claims.

BRIEF DESCRIPTION OF THE DRAWINGS

The preferred embodiment of the invention, illustrative of the best mode in which applicant has contemplated applying the principals is set forth in the following description and is shown in the drawings and is particularly and distinctly pointed out and set forth in the appended claims. The invention may take physical form in certain parts and arrangements of parts, numerous embodiments of which will be described in detail in the specification and illustrated in the accompanying drawings which form a part hereof, and wherein:

FIG. 3 is a series of graphical illustrations of the positions of the current centroids on the primary coil and shield coil as a function of discretization parameters $\sigma_{P,S}$, wherein

FIG. 4 is a series of graphical illustrations of the gradient strength non-linearity over a 50 cm×40 cm FoV as a function of the discretization parameters $\sigma_{P,S}$ when the current is varied, wherein

FIG. 5 is a series of graphical illustrations of the gradient strength non-uniformity over a 50 cm×40 cm FoV as a function of the discretization parameters $\sigma_{P,S}$ when the current is varied, wherein

FIG. 6 is series of graphical illustrations of the gradient strength at the isocenter as a function of the discretization parameters $\sigma_{P,S}$ when the current is varied, wherein

FIG. 7 is a series of graphical illustrations of the inductance of the coils with predetermined widths as the current is varied, wherein

FIG. 8 is a series of graphical illustrations of the maximum value of the residual eddy current effect as the current is varied, wherein

FIG. 9 is a series of graphical illustrations of the variation of the residual eddy current effect as the current is varied, wherein

FIG. 10 is a series of graphical illustrations of the dependence of the z-component of the total thrust force exerted on the gradient coil by the magnetic field of an existing 1.5 T magnet while the current is varied, wherein

FIG. 11 is a series of graphical illustrations of the dependence of the z-component of the total thrust force exerted on the cold shield by the magnetic field of an existing 1.5 T magnet while the current is varied, wherein

FIG. 14 is a series of graphical illustrations of the position of the various z-intercepts on the primary coil as a function of the parameters $0 \leq \sigma \leq 1$ and $\Delta$, wherein

FIG. 15 is a series of graphical illustrations of the position of the various z-intercepts on the shield coil as a function of the parameters $0 \leq \sigma \leq 1$ and $\Delta$, wherein

DETAILED DESCRIPTION OF THE INVENTION

Figure 1:
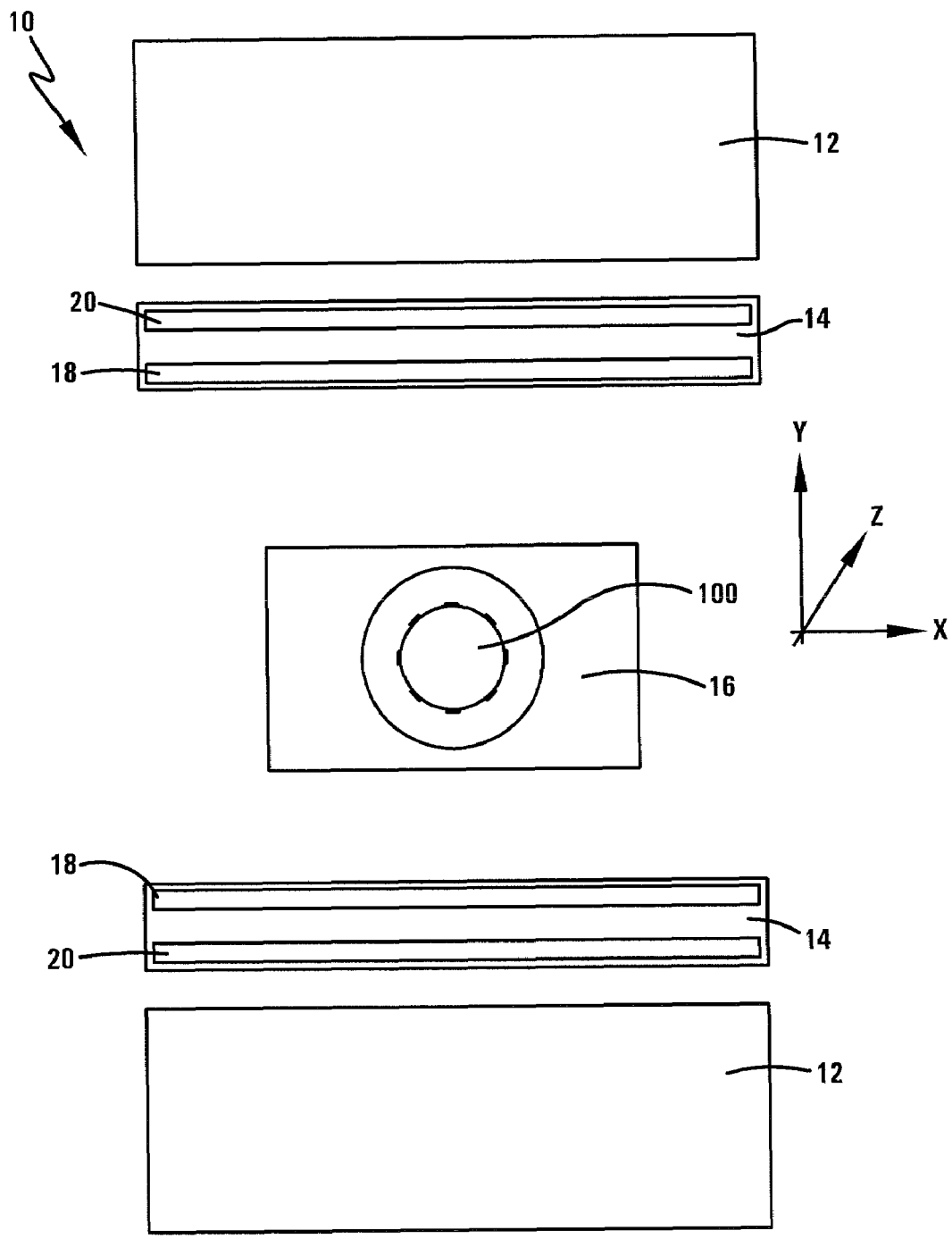
FIG. 1 is a Magnetic Resonance Imaging (MRI) system of Prior Art.
Figure 2:
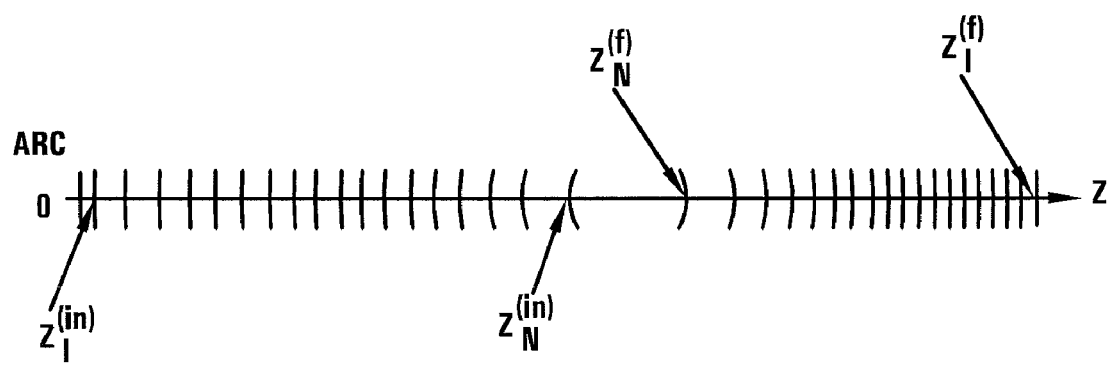
FIG. 2 is a chart indicating the Z-intercepts in one of four quadrants of a transverse gradient of the design of a transverse gradient coil designed by the Prior Art method.
Figure 3A:
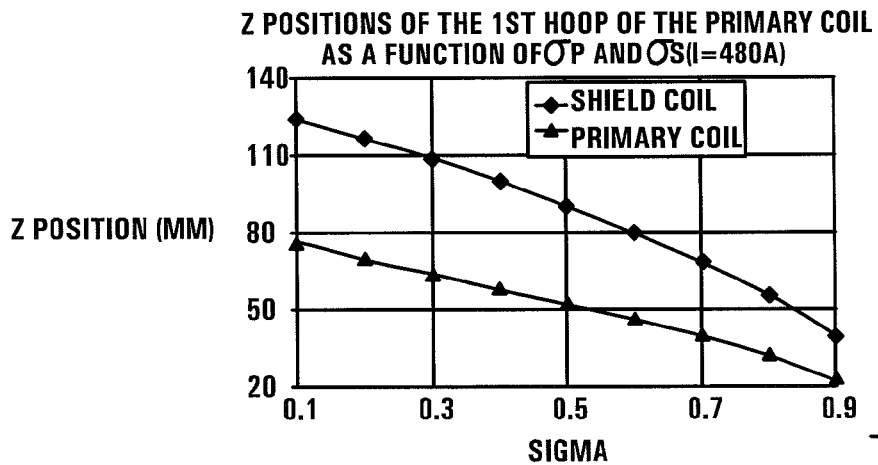
FIG. 3a represents positions of the first hoop.
Figure 3B:
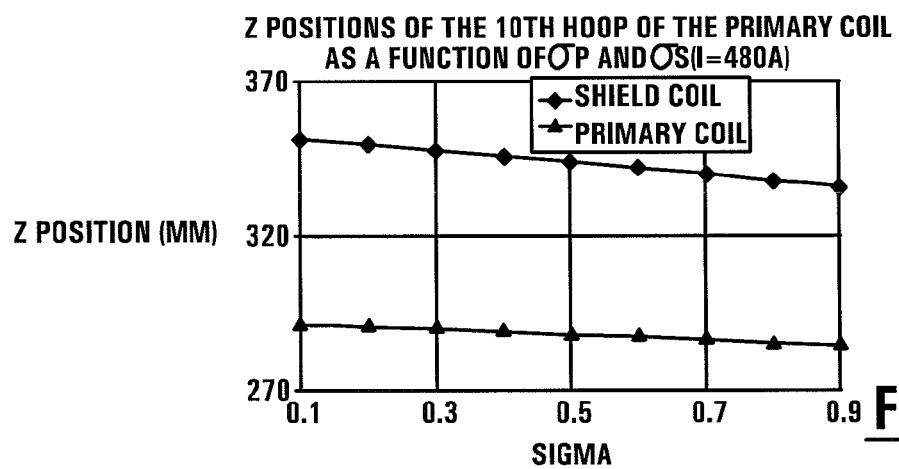
FIG. 3b represents positions of the tenth hoop.
Figure 3C:
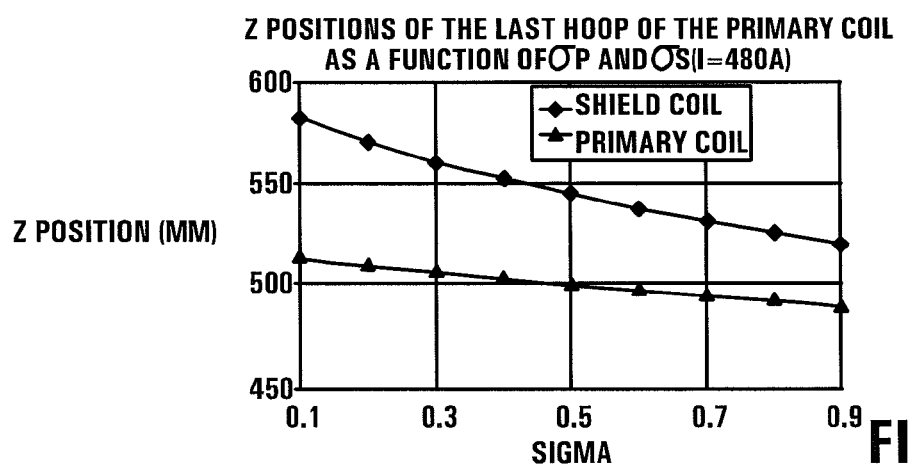
FIG. 3c represents positions of the last hoop.

Referring now to the drawings wherein the showings are for purposes of illustrating numerous embodiments of the invention only and not for purposes of limiting the same, the figures illustrate the novel idea of an improved method of discretization of the continuous current solution of a gradient coil design.

The present invention puts forth an improved method of gradient coil design using an improved discretization process of the continuous current solution. The present invention applies to the design of both axial and transverse gradient coil design.

Axial Gradient Coil

The method of designing an axial gradient coil of embodiments of the invention, wherein the axial gradient coil having a primary coil and a shield coil for use in magnetic resonance imaging, includes defining at least one performance characteristic of the axial gradient coil, concurrently varying at least two parameters within at least one equation, wherein each result of the varied at least two parameters within the at least on equation produces a different hypothetical axial gradient coil design, evaluating at least one performance characteristic of each hypothetical axial gradient coil design produced by the varied parameters; and selecting one of the hypothetical axial gradient coil designs.

In embodiments of the method of designing an axial gradient coil using the method of this invention, desired performance characteristics of the gradient coil design are often defined. The desired performance characteristics are not limited by the method of this invention, and are commonly determined with consideration being given to the specifications and design characteristics of the MRI system in which the gradient coil will be operating. The desired performance characteristics may be determined to be specific ranges, to be greater than or less than certain values, or may even be determined in general terms.

Once design characteristics have been determined, in a preferred embodiment of the current invention, the design of an axial gradient coil can be optimized in part by use of the following two-part equation, wherein the first portion of the equation applies to the primary coil design and the second portion applies to the shield coil design $$\int_0^{z_n^{(P)}} f_\varphi^{(P)}(z)\,dz - (n - \sigma_P)I = 0, \qquad \text{(Equation 4)}$$

$$\int_0^{z_m^{(S)}} f_\varphi^{(S)}(z)\,dz + (m - \sigma_S)I = 0$$

Within Equation 4, n is an integer between 1 and the number of turns on the primary coil ($1 \leq n \leq N_P$) and m is an integer between 1 and the number of turns on the shield coil ($1 \leq m \leq N_S$). Within Equation 4, $\sigma_{P,S}$ (discretization parameters) are greater than 0 and less than 1 ($0 \leq \sigma_{P,S} \leq 1$) and $\sigma_{P,S}$ (discretization parameters) and I (current parameter) are the parameters of interest.

Using Eq. (4), the current parameter I and discretization parameters $\sigma_{P,S}$ are concurrently varied numerically to investigate the tradeoffs in achieving the desired goals: field quality characteristics within the FoV, minimum energy/inductance, minimum coil resistance, minimum eddy current effect and its variation over the surface of the FoV, minimum net thrust force exerted on the coil and on the cold shield (due to the eddy currents). In certain embodiments, the current parameter I is varied reasonably close to the maximum available current ($I_{MAX}$).

Each set of concurrently varied parameters provides a different hypothetical gradient coil design, wherein each different design offers different performance characteristics. Using the method of the present invention, the position of the current centroids in the hypothetical designs are very sensitive to the variation of the discretization parameters $\sigma_{P,S}$. The positions of the current centroids are less sensitive to the variation of the discretization current I. This results in the sensitivity of the coil characteristics to the variation of the discretization parameters $\sigma_{P,S}$ and current I. It is foreseen by this invention that the position of the current centroids may be limited to incorporate various predetermined design and system parameters. For example, the position of the current centroids may be required to have a minimum separation to allow for a predetermined width off the conductors on the primary or shield coil.

The performance characteristics of the various hypothetical designs are then evaluated. The performance characteristics of each design is typically compared to the earlier defined desired performance characteristics for the final design found through the method of this invention. The hypothetical design that is evaluated as best providing the desired defined performance characteristics is often selected as the final design.

The following hypothetical example illustrates the method of the present invention, and in no way limits the invention. All chosen values are for example purposes only. For the current example, $I_{MAX}$ will be assumed to be 500 Amps ($I_{MAX}$=500 A) and will be varied reasonably close to that value. The discretization parameters $\sigma_{P,S}$ will be varied between 0.1 and 0.9. In actual practice of the method of the present invention, no limits exist on the value of $I_{MAX}$, or the discretization parameters $\sigma_{P,S}$, and the parameters may be determined due to design and system parameters of the circumstances at hand.

FIGS. 3-11 illustrate various characteristics of the gradient coil design of the present example through theoretical calculations, simulations and models using the method of this invention. FIGS. 3a through 3c show the sensitivity of the current centroids z-position on the primary coil and shield coil as a function of the discretization parameters $\sigma_{P,S}$ (values varying between 0.1 and 0.9) when the current I=480 A. FIG. 3a illustrates the z-positions of the first current centroid on the primary and shield coil as a function of $\sigma_{P,S}$ when I=480 A. FIG. 3b illustrates the z-positions of the tenth current centroid on the primary and shield coil as a function of $\sigma_{P,S}$ when I=480 A. FIG. 3c illustrates the z-positions of the last current centroid on the primary and shield coil as a function of $\sigma_{P,S}$ when I=480 A.

Figure 4A:
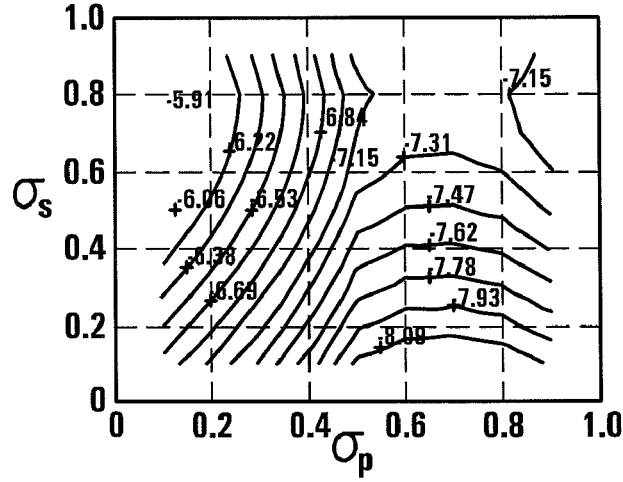
FIG. 4a represents I=470 Amps (A)
Figure 4B:
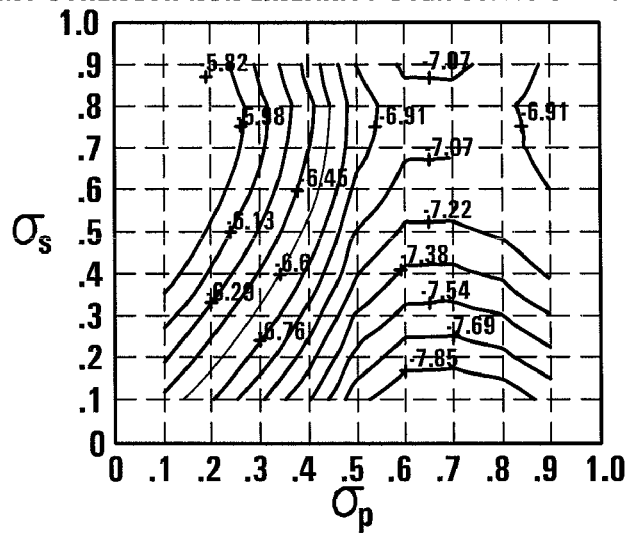
FIG. 4b represents I=480 A.
Figure 4C:
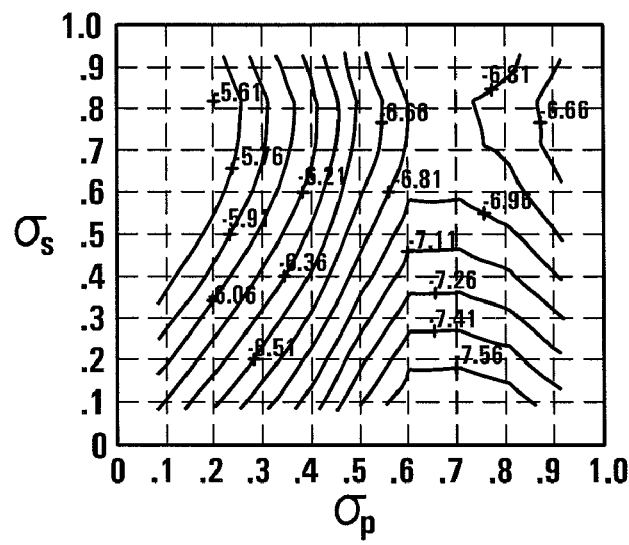
FIG. 4c represents I=490 A.
Figure 5A:
FIG. 5a represents I=470 A.
Figure 5A:
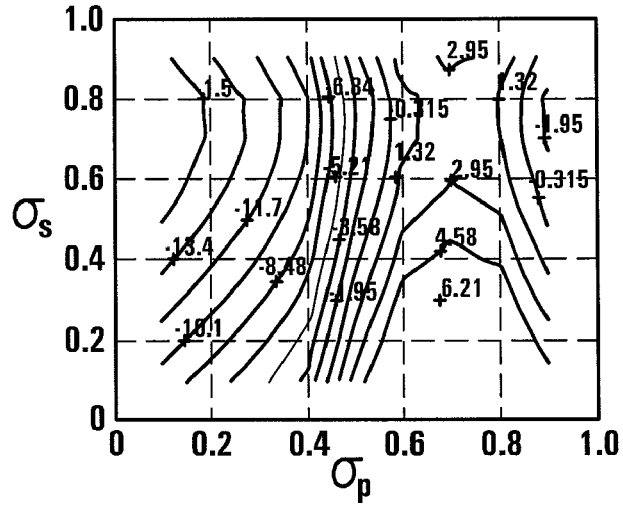
Figure 5B:
FIG. 5b represents I=480 A.
Figure 5B:
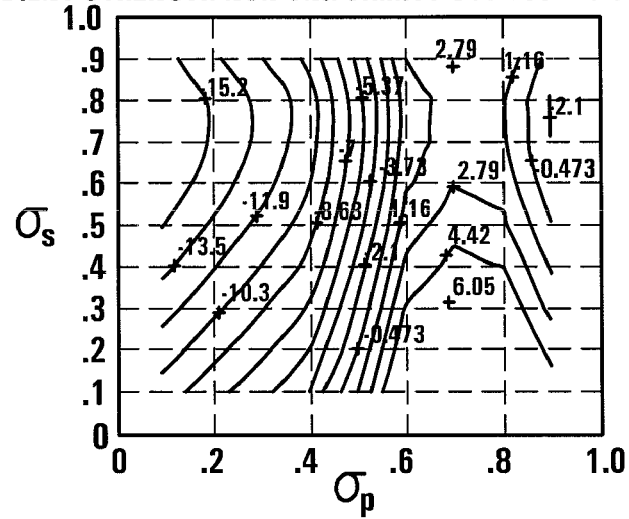
Figure 5C:
FIG. 5c represents I=490 A.
Figure 5C:
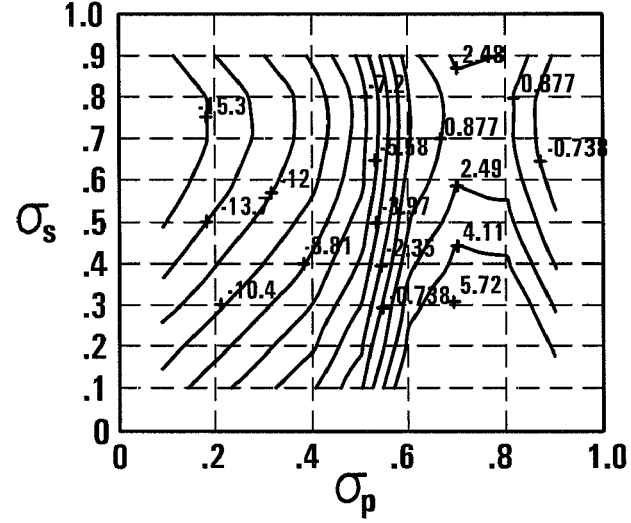
Figure 6A:
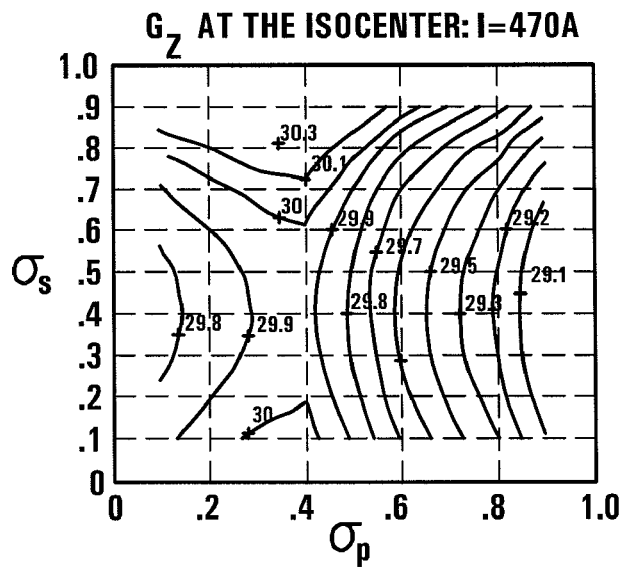
FIG. 6a represents I=470 A.
Figure 6B:
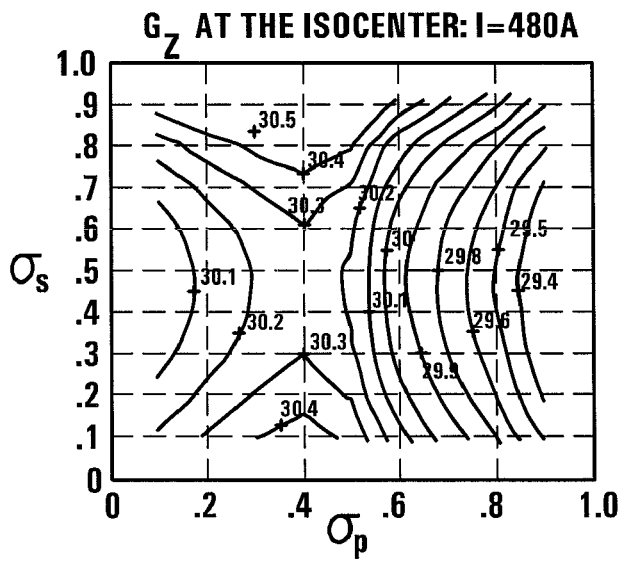
FIG. 6b represents I=480 A.
Figure 6C:
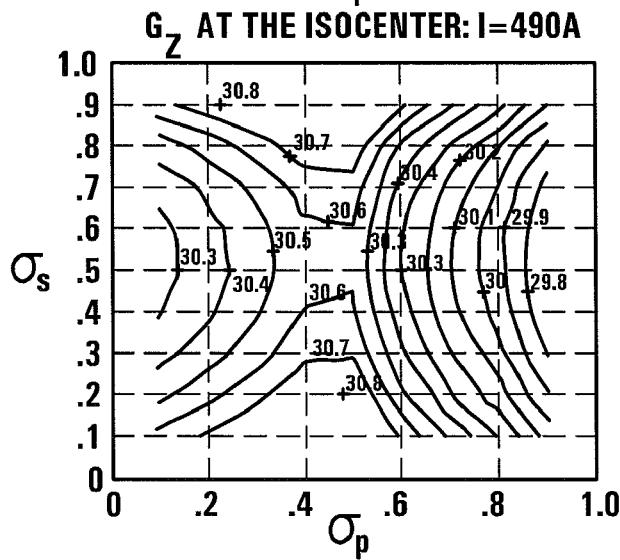
FIG. 6c represents I=490 A.

FIGS. 4-6 illustrate the tradeoffs of the variations of the discretization parameters $\sigma_{P,S}$ and current I and the effects on the sensitivity of the coil characteristics. FIGS. 4a through 4c illustrate the gradient strength non-linearity over a 50 cm×40 cm FoV as a function of the discretization parameters when the current is varied (FIG. 4a, I=470 A; FIG. 4b, I=480 A and FIG. 4c, I=490 A). FIGS. 5a through 5c illustrate the gradient strength non-uniformity over a 50 cm×40 cm FoV as a function of the discretization parameters when the current is varied (FIG. 5a, I=470 A; FIG. 5b, I=480 A and FIG. 5c, I=490 A). FIGS. 6a through 6c illustrates the gradient strength at the isocenter as a function of the discretization parameters when the current is varied (FIG. 6a, I=470 A; FIG. 6b, I=480 A and FIG. 6c, I=490 A).

Figure 7A:
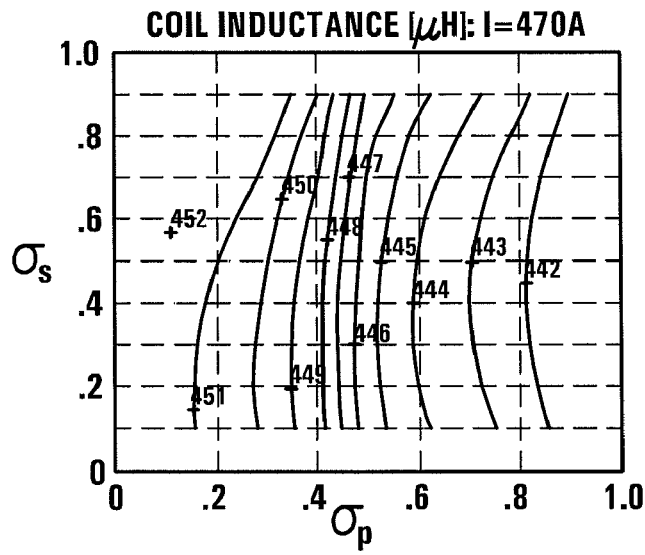
FIG. 7a represents I=470 A.
Figure 7B:
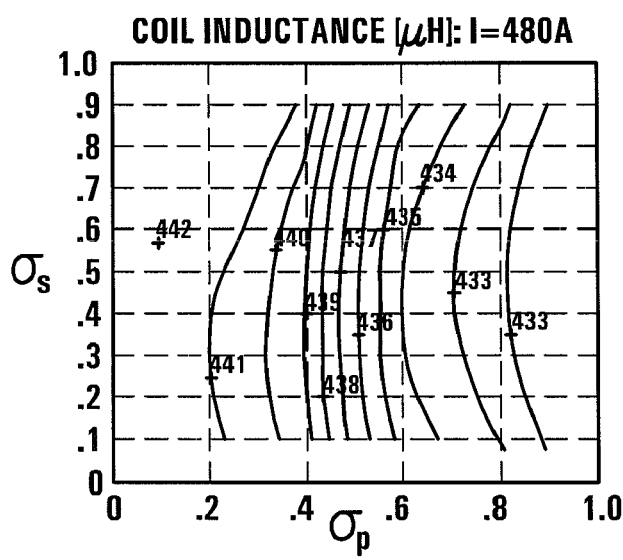
FIG. 7b represents I=480 A and FIG. 7c represents I=490 A.
Figure 7C:
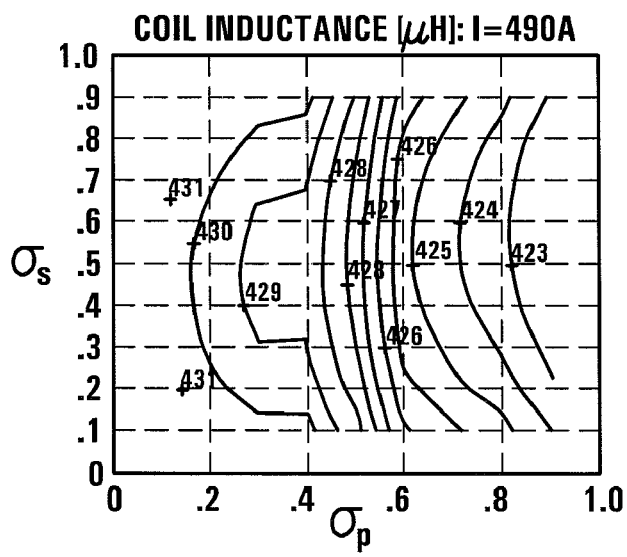

For the purposes of the current example, the minimum separation between the centroids is limited to be greater than 9.2 mm on the primary coil and greater than 17.3 mm on the shield coil. These minimum separations allow for the width of the conductors on the primary coil to be 8 mm and the width of the conductors on the shield coil to be 10 mm. FIGS. 7a through 7c illustrate the inductance of the coils with these predetermined widths as the current is varied (FIG. 7a, I=470 A; FIG. 7b, I=480 A and FIG. 7c, I=490 A).

The residual eddy current effect (RECE) within the example above is defined as:

$$RECE(r) = \left.\frac{B_z^{CS}(r)}{B_z^{Coil}(r)}\right|_{FoV} \times 100\% \qquad \text{(Equation 5)}$$

Figure 8A:
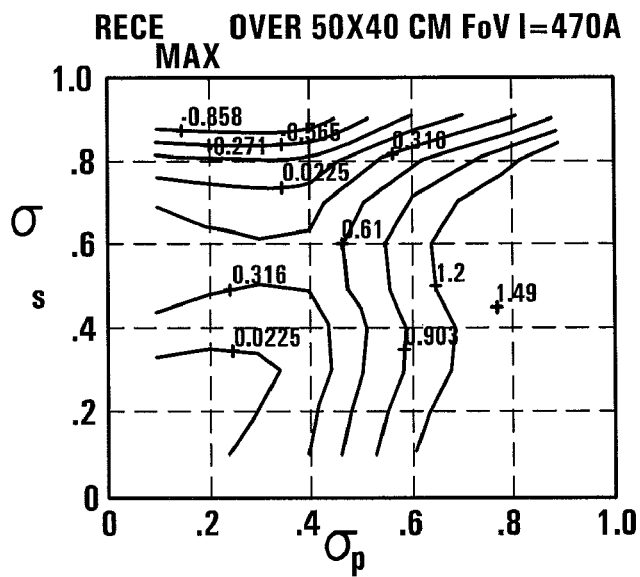
FIG. 8a represents I=470 A.
Figure 8B:
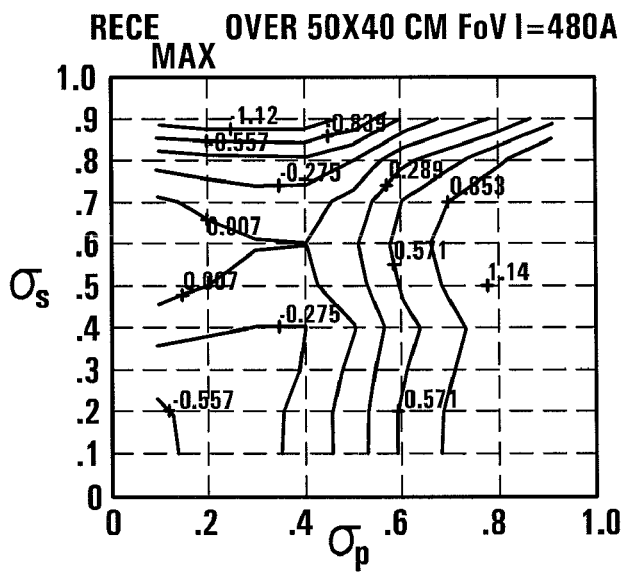
FIG. 8b represents I=480 A and FIG. 8c represents I=490 A.
Figure 8C:
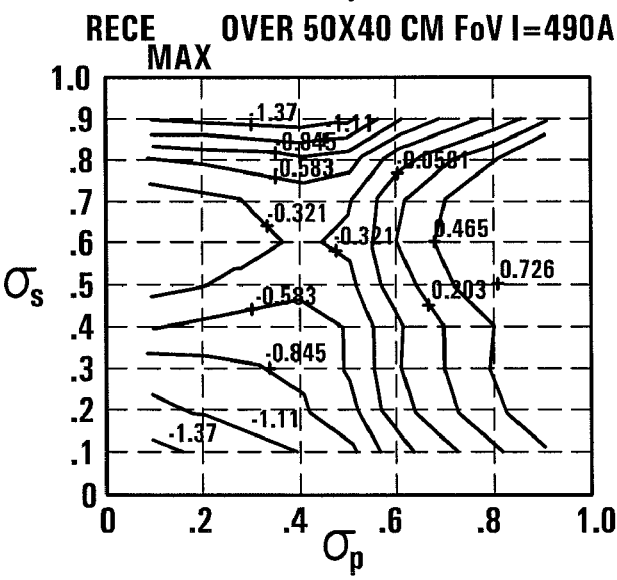
Figure 9A:
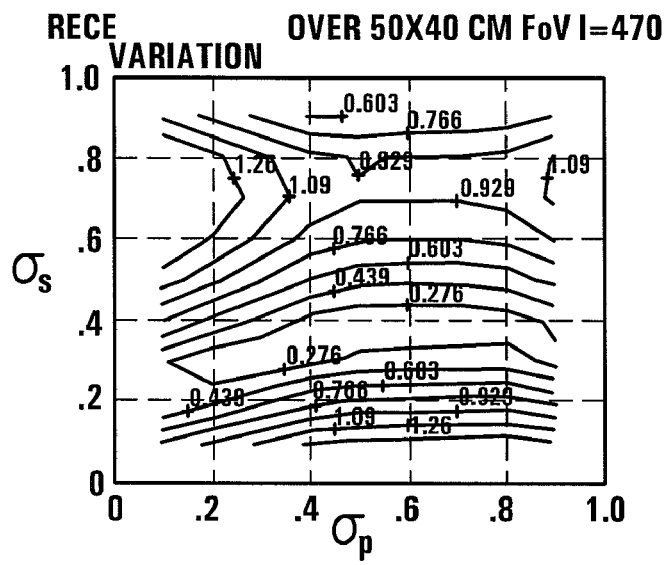
FIG. 9a represents I=470 A.
Figure 9B:
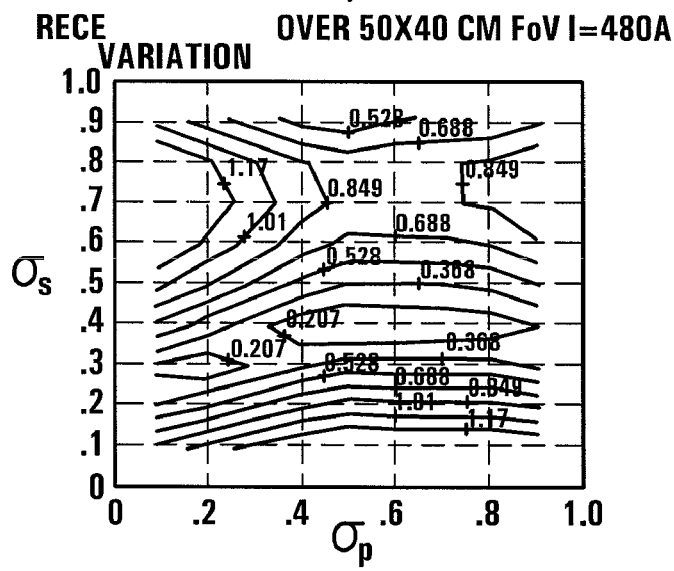
FIG. 9b represents I=480 A.
Figure 9C:
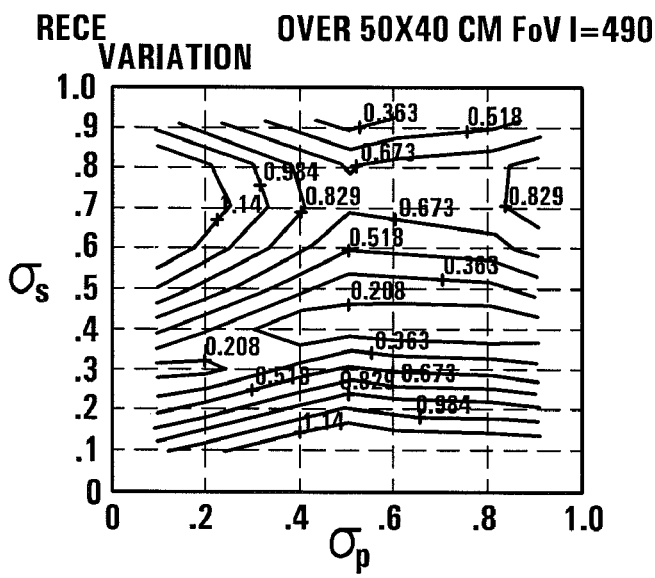
FIG. 9c represents I=490 A.

It is desirable that RECE and its variation over the FoV are as small as possible. FIGS. 8a through 8c and FIGS. 9a through 9c illustrate the dependence of the RECE on the surface of the FoV within the example. FIGS. 8a through 8c show the maximum value of RECE, while FIGS. 9a through 9c show the variation of the RECE considering the variations of current (FIGS. 8a and 9a, I=470 A; FIGS. 8b and 9b, I=480 A; and FIGS. 8c and 9c, I=490 A).

Figure 10A:
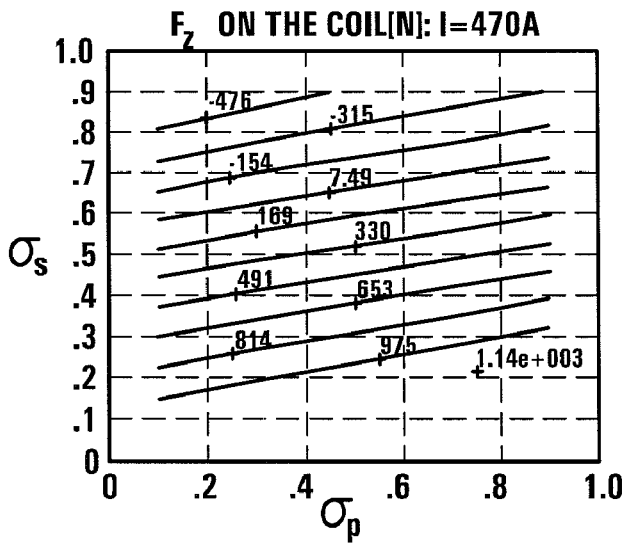
FIG. 10a represents I=470 A.
Figure 10B:
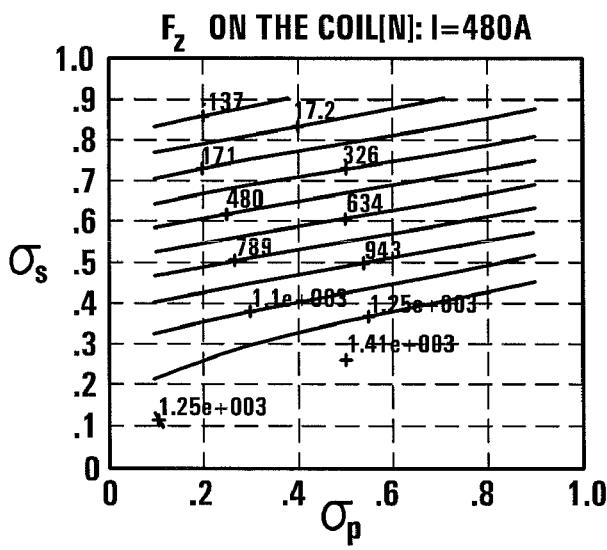
FIG. 10b represents I=480 A and FIG. 10c represents I=490 A.
Figure 10C:
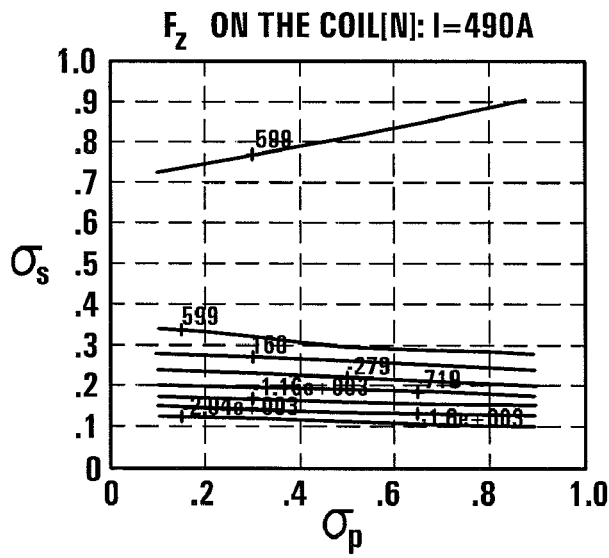
Figure 11A:
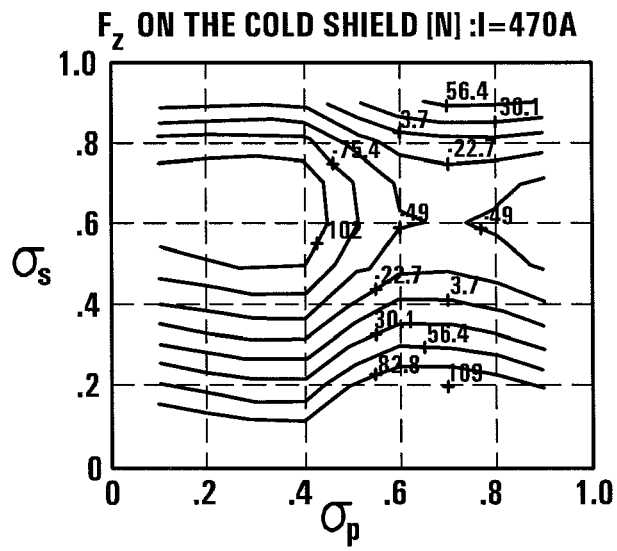
FIG. 11a represents I=470 A.
Figure 11B:
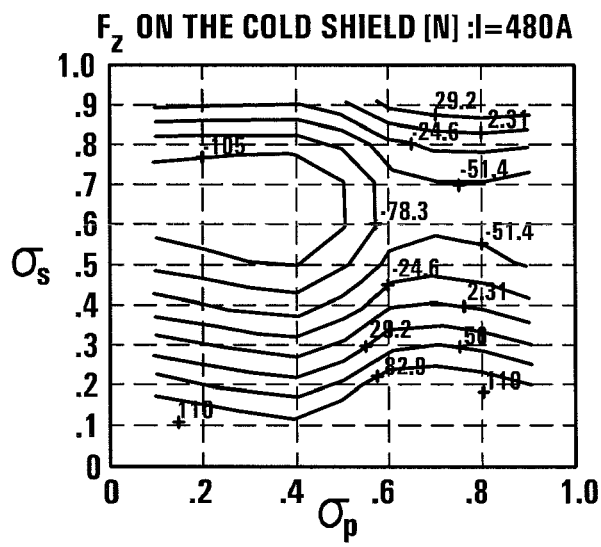
FIG. 11b represents I=480 A.
Figure 11C:
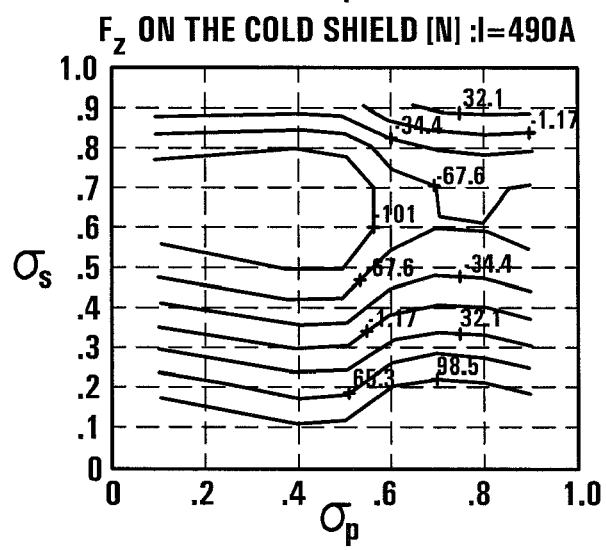
FIG. 11c represents I=490 A.

FIGS. 10a through 10c and FIGS. 11a through 11c illustrate the dependence of the z-component of the total thrust force as exerted on the gradient coil and the cold shield under the varying currents. FIGS. 10a through 10c illustrate the dependence of the z-component of the total thrust force exerted on the gradient coil of this example by the magnetic field of an existing 1.5 T magnet, considering the varying currents (FIG. 10a, I=470 A; FIG. 10b, I=480 A and FIG. 10c, I=490 A). FIGS. 11a through 11c illustrate the dependence of the z-component of the total thrust force exerted on the cold shield of this example by the magnetic field of an existing 1.5 T magnet, considering the varying currents (FIG. 1a, I=470 A; FIG. 11b, I=480 A and FIG. 11c, I=490 A).

Figure 12:
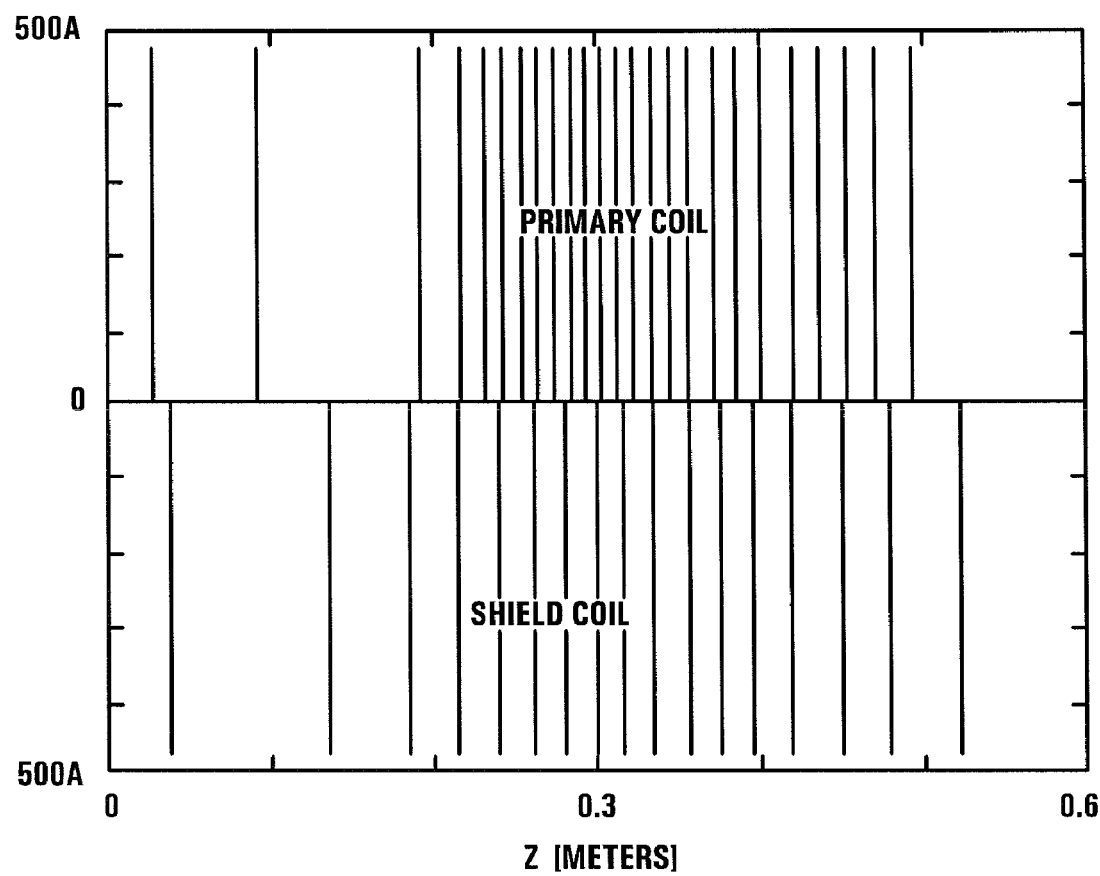
FIG. 12 is a graphical illustrations of the positions of the turns on half of the primary and shield coils when $\sigma_P$=0.8, $\sigma_S$=0.9, and I=480 A.

In the current example, considering the characteristics and tradeoffs shown in FIGS. 3-11, $\sigma_P$ is chosen to equal 0.8 and $\sigma_S$ is chosen to equal 0.9. The current is chosen to equal 480 A. With these assigned values, FIG. 12 illustrates the theoretical positions of the turns on half of the primary and shield coils using the method of this invention. Table 1, below, illustrates the properties of the chosen coil design.

TABLE 1

Properties of the gradient coil of the example

| Property | Value |
|---|---|
| Electrical Length (P/S) [mm] | 993.0/1050.00 |
| Resistance [mΩ] | 61.1/38.89 |
| Energy @ Gz = 30 m T/m | 50.00 |
| Current [A] for Gz = 30 m T/m | 478.60 |
| Inductance [μH] | 436.64 |
| Slew rate [T/m/s] (losses not included) @ Gz = 30 m T/m and V = 1200 V | 166.0 |
| Rise time [sec] (losses not included) | 181.0 |
| DC Dissipated power [kW] @ Gz = 30 m T/m | 22.9 |
| Thrust force on the Coil [lbs] @ Gz = 30 m T/m | −8.0 |
| Thrust force on the Cold Shield [lbs] @ Gz = 30 m T/m | 10.1 |
| RECE_max [%]/RECE_variation [%] | −0.05/0.33 |
| Global non-linearity [%] at z = 0.2 m | −6.92 |
| Local non-linearity [%] at z = 0.2 m | −25.3 |
| Max/min Non-uniformity [%] at ρ = 0.25 m | 1.1/−1.1 |

Transverse Gradient Coil

Further embodiments of the invention involve a method of designing a transverse gradient coil for use in magnetic resonance imaging which includes defining at least one performance characteristic of the transverse gradient coil, concurrently varying at least two parameters within at least one equation wherein each set of varied parameters produces a different hypothetical transverse gradient coil design, evaluating at least one performance characteristic of each hypothetical transverse gradient coil design produced by the varied parameters; and selecting one of the hypothetical transverse gradient coil designs.

In further embodiments, similar to the above method for designing the axial gradient coil, in the method of designing a transverse gradient coil using the method of this invention, desired performance characteristics of the gradient coil design are often defined. The desired performance characteristics again are not limited by the method of this invention, and are commonly determined with consideration being given to the specifications and design characteristics of the MRI system in which the gradient coil will be operating. The desired performance characteristics may be determined to be specific ranges, to be greater than or less than certain values, or may even be determined in general terms.

Once design characteristics have been determined, in a preferred embodiment of the current invention, a transverse gradient coil can be designed using a further preferred embodiment of the method of this invention, we consider the following set of equations:

$$\varphi = \Phi_n(z) \quad \text{(Equation 6)}$$

$$\Phi_n(z) = \arccos(S_n / f_z(z))$$

$$S_n = \frac{n-\sigma}{N}(f_z(z_{eye}) - \Delta)$$

In the set of equations labeled Eq. (6), two discretization parameters are introduced that govern the positions of the z-intercepts and current paths, thus the gradient coil properties. These discretization parameters are defined as: $0 \leq \sigma \leq 1$ and $\Delta$. The parameter $\Delta$ can also be used to match the currents on the primary and shield coils of the gradient coil during discretization of the continuous current densities.

Each set of concurrently varied parameters provides a different hypothetical gradient coil design, wherein each different design offers different performance characteristics. The performance characteristics of the various hypothetical designs are then evaluated. The performance characteristics of each design are typically compared to the earlier defined desired performance characteristics for the final design found through the method of this invention The hypothetical design that is evaluated as best providing the desired defined performance characteristics is often selected as the final design.

Again, the following hypothetical example illustrates the method of the present invention, and in no way limits the invention. All chosen values are for example purposes only. For this example, the maximum current is again limited to 500 A ($I_{max}$=500 A), and the gradient strength is predetermined to be 30 mT/m ($G_x$=30 mT/m). In actual practice of the method of the present invention, no limits exist on the value of $I_{MAX}$, or the desired gradient strength ($G_x$) and the values may be determined due to design and system parameters of the circumstances at hand.

Figure 13:
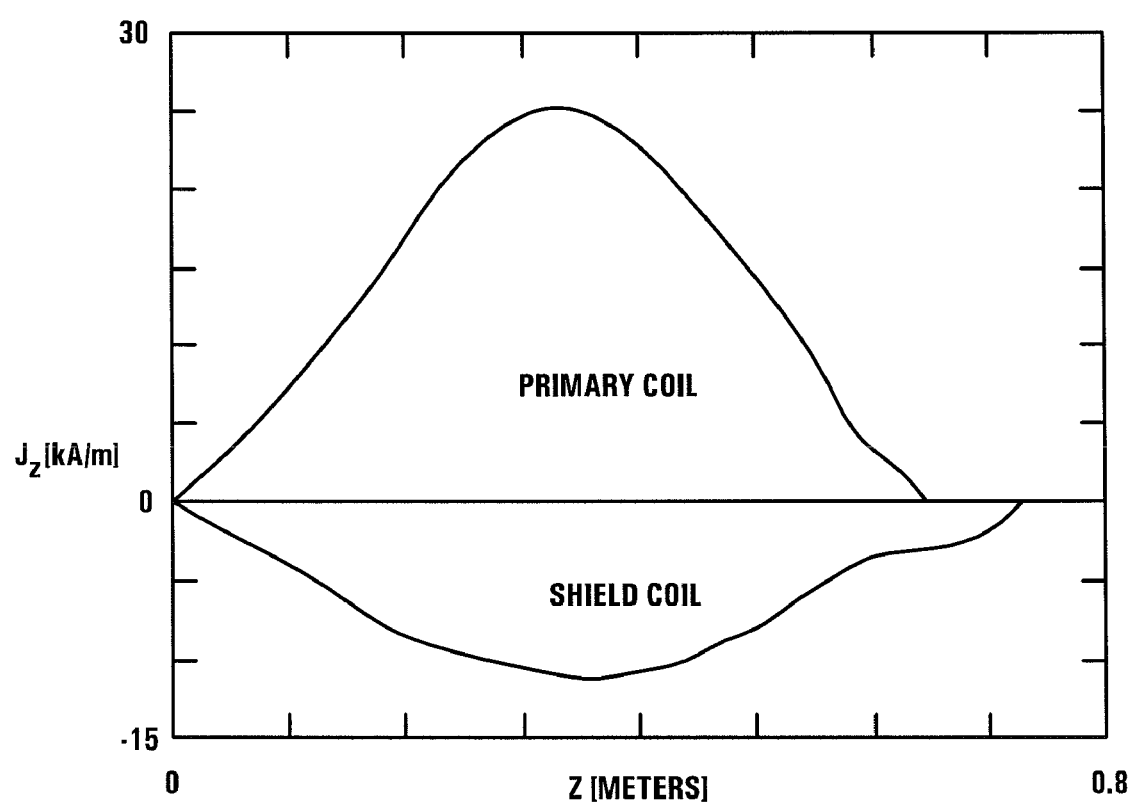
FIG. 13 is a graphical illustration of an example of z-components of the continuous current densities on the primary and shield coils that satisfy some field quality characteristics and the gradient strength of $G_x$=30 mT/m.

FIGS. 13-17 illustrate various characteristics of the gradient coil design of the present example through theoretical calculations, simulations and models using the method of this invention. FIG. 13 illustrates an example of z-components of the continuous current densities on the primary and shield coils that satisfy some field quality characteristics and the gradient strength of $G_x$=30 mT/m. When limiting the maximum current to 500 A ($I_{max}$=500 A), the current densities shown in FIG. 13 can be discretized with the number of primary coils being 18 ($N_p$=18) and the number of secondary coils being 10 ($N_s$=10).

Figure 14A:
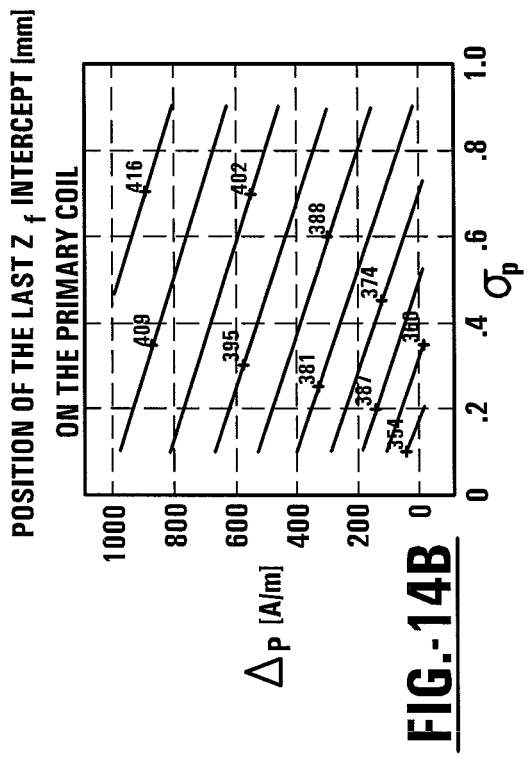
FIG. 14a shows the first initial z-intercept.
Figure 14B:
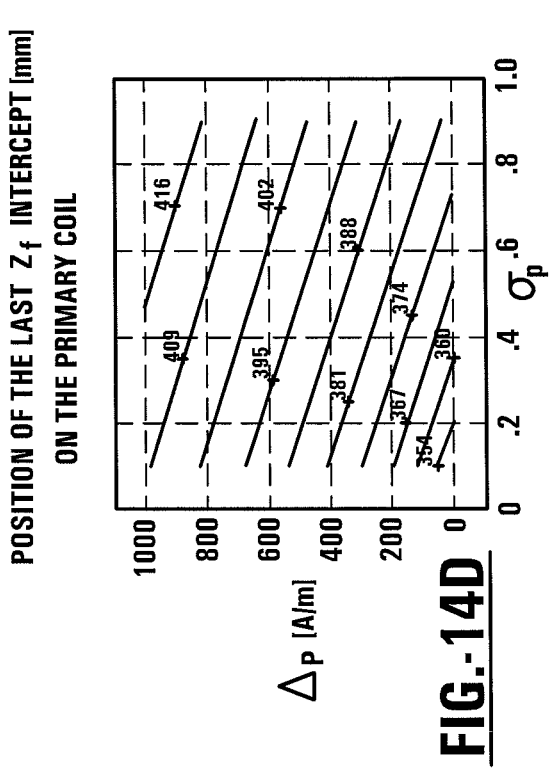
FIG. 14b shows the first final z-intercept.
Figure 14C:
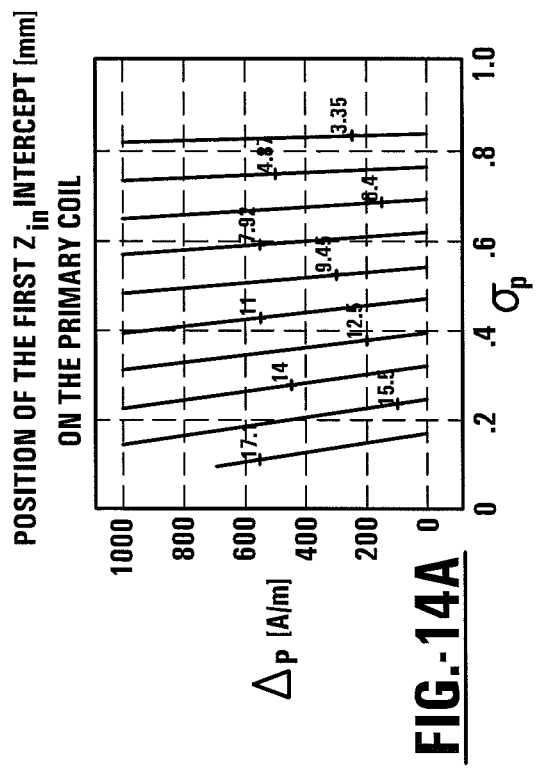
FIG. 14c shows the last initial z-intercept.
Figure 14D:
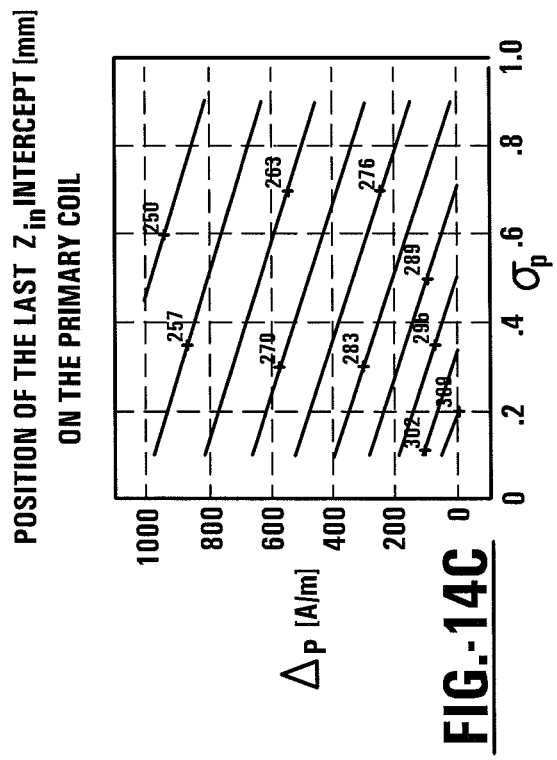
FIG. 14d shows the last final z-intercept.
Figure 15A:
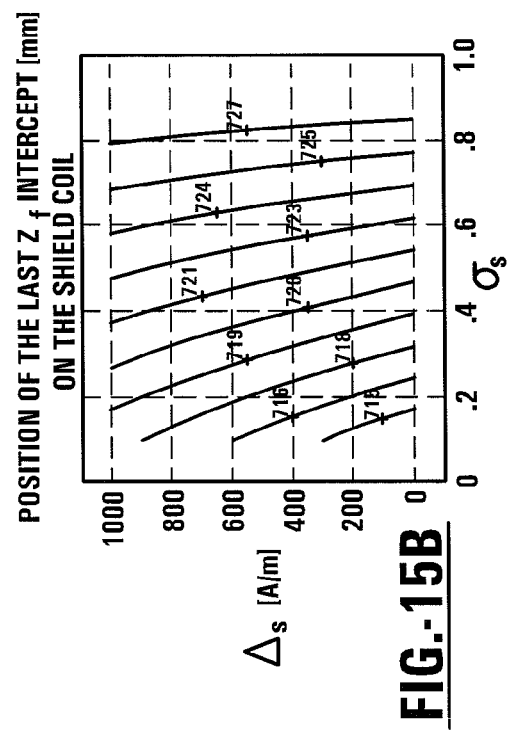
FIG. 15a shows the first initial z-intercept.
Figure 15B:
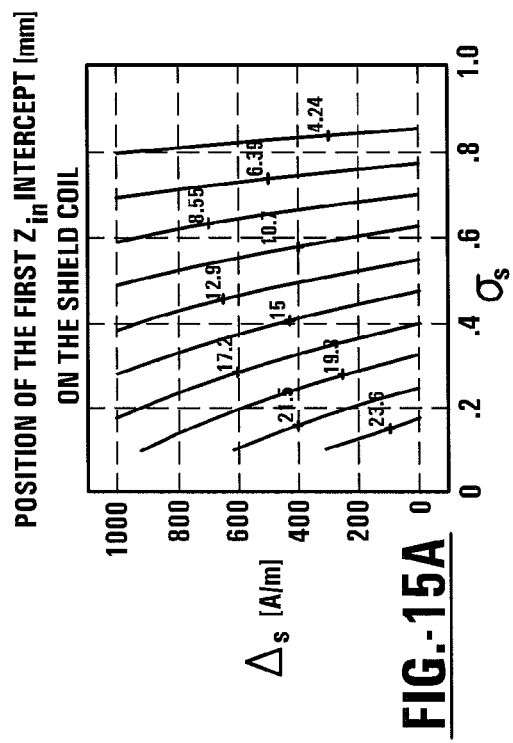
FIG. 15b shows the first final z-intercept.
Figure 15C:
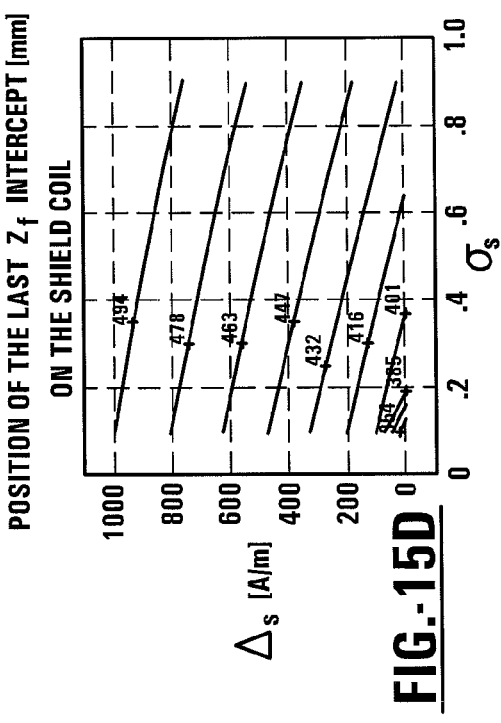
FIG. 15c shows the last initial z-intercept.
Figure 15D:
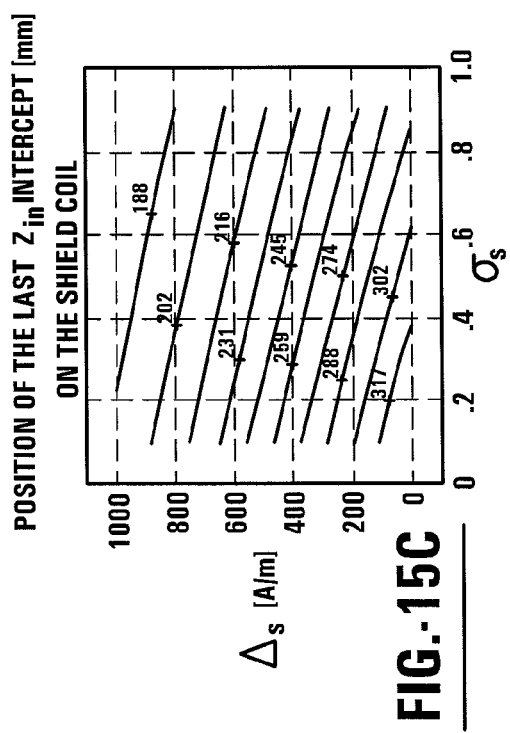
FIG. 15d shows the last final z-intercept.

FIGS. 14a through 14d and FIGS. 15a through 15d illustrate the sensitivity of the z-intercepts on the primary coil and shield coil, respectively to the variation of the parameters $0 \leq \sigma \leq 1$ and $\Delta$. FIGS. 14a through 14d show the position of the various z-intercepts on the primary coil as a function of the parameters $0 \leq \sigma \leq 1$ and $\Delta$ (FIG. 14a shows first initial z-intercept; FIG. 14b shows first final z-intercept, FIG. 14c shows the last initial z-intercept; and FIG. 14d shows the last final z-intercept). FIGS. 15a through 15d show the position of the various z-intercepts on the shield gradient coil as a function of the parameters $0 \leq \sigma \leq 1$ and $\Delta$ (FIG. 15a shows first initial z-intercept; FIG. 15b shows first final z-intercept, FIG. 15c shows the last initial z-intercept; and FIG. 15d shows the last final z-intercept).

Figure 16A:
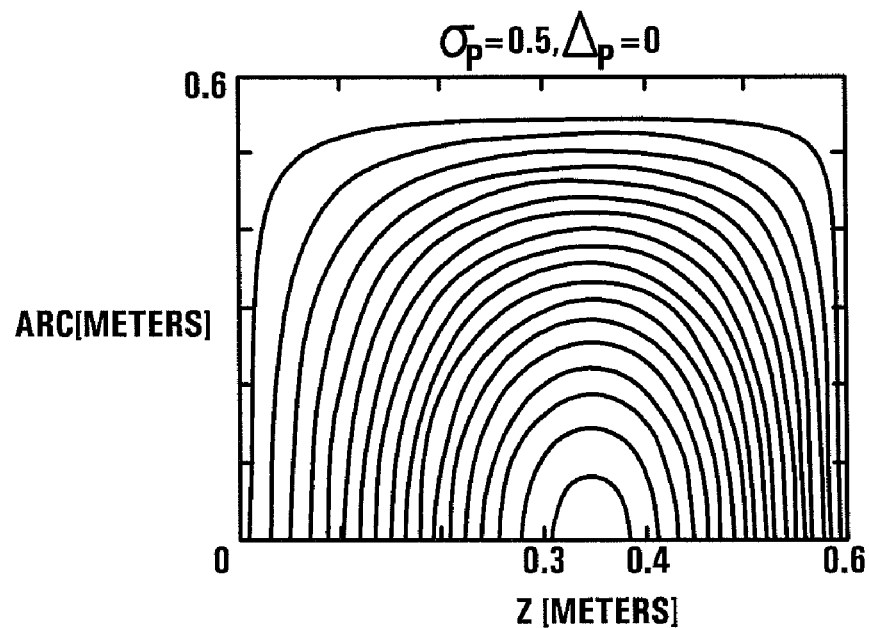
FIG. 16 is a series of graphical illustrations of a comparison of the current paths on the primary coil when $\sigma_P$=0.5, and when $\Delta_P$=0 as shown in FIG. 16a and when $\Delta_P$=500 as shown in FIG. 16b.
Figure 16B:
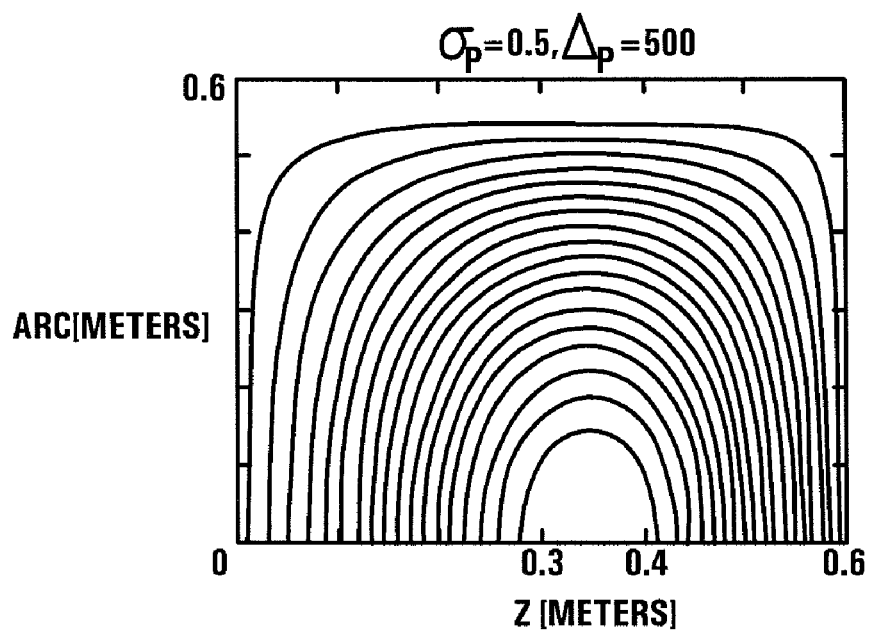

It is apparent from FIGS. 14a through 14c and FIGS. 15a through 15d that while the positions of the first z-intercepts are sensitive to the variation of the parameters $\sigma$ and $\Delta$, the positions of the last z-intercepts are extremely sensitive to these variations. The positions of the last z-intercepts are especially sensitive to the parameters $\Delta_P$ and $\Delta_S$. Illustrating this sensitivity, FIGS. 16a and 16b show a comparison of the current paths on the primary coil when $\sigma_P$=0.5, and when $\Delta_P$=0 (FIG. 16a) and when $\Delta_P$=500 (FIG. 16b).

Figure 17A:
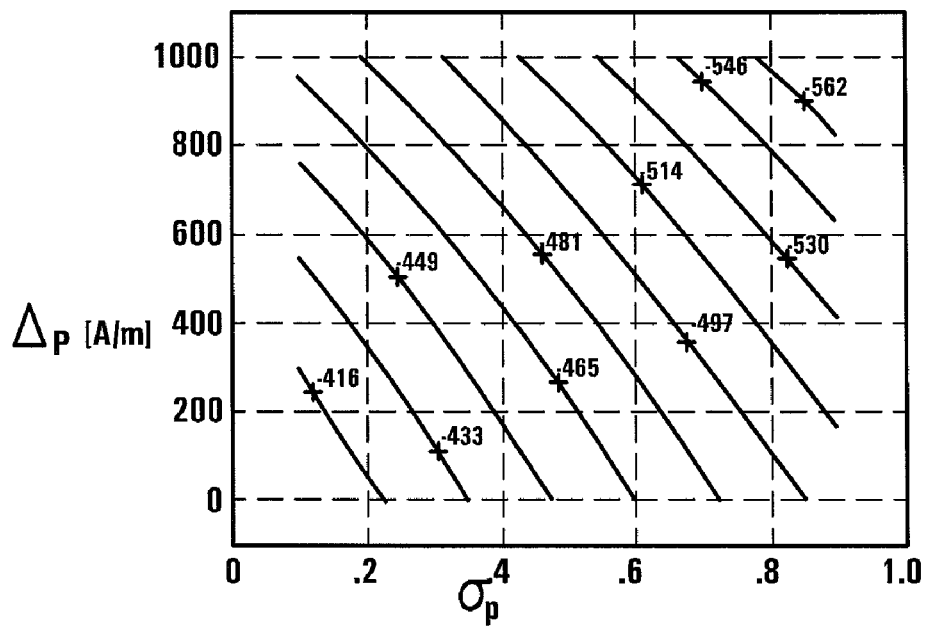
FIG. 17 is a series of graphical illustrations of the dependence of the net thrust force, measured in lbs., at G=30 mT/m exerted on the primary gradient coil as shown in FIG. 17a and on the shield gradient coil as shown in FIG. 17b placed inside of an existing magnet.
Figure 17B:
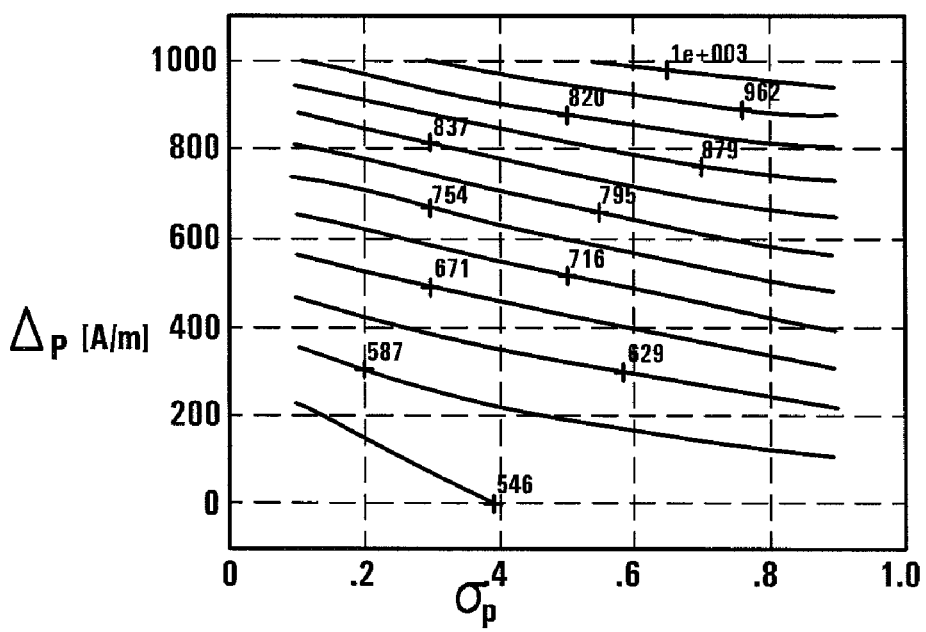

FIGS. 17a and 17b illustrate the dependence of the net thrust force, measured in lbs., at G=30 mT/m exerted on the primary (FIG. 17a) and shield (FIG. 17b) gradient coil placed inside of an existing magnet.

Investigation using an embodiment of the method of this invention as applied to the above example allows the identification of a set of discretization parameters that give an optimized gradient coil design, taking into consideration the desired parameters and trade-offs of the various characteristics of the gradient coil design as determined by the design specifications. The further limitations and characteristics shown below are desired for the gradient design of the above example and are determined by the existing and desired system characteristics and limitations:

−28%≦Gradient Strength Non-Uniformity≦−32%
  |Gradient Strength Non-Linearity|≦6%
  |Trust Force on the Gradient|≦120 lbs
  Current for G=30 mT/m<500 A
  |RECE$_{MAX}$|<0.8%, RECE$_{Variation}$<0.4%

Tables 2 and 3, below, shows an example of the discretization parameters that allow for a gradient design meeting the desired characteristics, which were determined by using an embodiment of this invention:

TABLE 2

Discretization parameters allowing the gradient coil to meet the predetermined desired characteristics

| $\Delta_P$ [A/m] | $\sigma_P$ | $\Delta_S$ [A/m] | $\sigma_S$ | Non-linearity[%] | Non-Uniformity[%] | Current [A] for G = 30 m T/m |
|---|---|---|---|---|---|---|
| 0 | 0.6 | 300 | 0.4 | 2.93 | −31.27 | 480.09 |
| 0 | 0.7 | 0.0 | 0.6 | 4.29 | −31.78 | 472.68 |
| 300 | 0.6 | 600 | 0.3 | 3.14 | −29.45 | 473.37 |
| 600 | 0.4 | 0.0 | 0.6 | −0.73 | −29.32 | 488.08 |
| 600 | 0.5 | 300 | 0.5 | 1.07 | −30.31 | 478.99 |
| 600 | 0.6 | 0.0 | 0.7 | 2.09 | −30.64 | 473.30 |
| 900 | 0.3 | 0.0 | 0.6 | −2.07 | −28.66 | 488.77 |
| 900 | 0.4 | 300 | 0.5 | −0.35 | −29.62 | 479.99 |
| 900 | 0.5 | 0.0 | 0.7 | 0.53 | −29.90 | 474.78 |
| 900 | 0.5 | 600 | 0.4 | 1.36 | −30.55 | 471.86 |
| 1200 | 0.3 | 300 | 0.5 | −1.66 | −28.98 | 480.51 |
| 1200 | 0.4 | 600 | 0.4 | −0.03 | −29.89 | 472.69 |

TABLE 3

Discretization parameters allowing the gradient coil to meet the predetermined desired characteristics

| $\Delta_P$ [A/m] | $\sigma_P$ | $\Delta_S$ [A/m] | $\sigma_S$ | $RECE_{MAX}$ [%] | $RECE_{VAR}$ [%] | Thrust Force [lbs] on the Gradient at G = 30 mT/m | Thrust Force [lbs] on the Cold Shield at G = 30 mT/m |
|---|---|---|---|---|---|---|---|
| 0 | 0.6 | 300 | 0.4 | 0.538 | 0.344 | 92.08 | 34.04 |
| 0 | 0.7 | 0.0 | 0.6 | −0.211 | 0.392 | 70.32 | 68.76 |
| 300 | 0.6 | 600 | 0.3 | 0.278 | 0.199 | 46.28 | 10.34 |
| 600 | 0.4 | 0.0 | 0.6 | 0.037 | 0.228 | 99.71 | 48.61 |
| 600 | 0.5 | 300 | 0.5 | 0.509 | 0.282 | 98.61 | 31.10 |
| 600 | 0.6 | 0.0 | 0.7 | −0.151 | 0.267 | 71.47 | 62.28 |
| 900 | 0.3 | 0.0 | 0.6 | −0.307 | 0.249 | 106.75 | 45.04 |
| 900 | 0.4 | 300 | 0.5 | 0.061 | 0.141 | 105.57 | 27.62 |
| 900 | 0.5 | 0.0 | 0.7 | −0.562 | 0.153 | 78.30 | 59.01 |
| 900 | 0.5 | 600 | 0.4 | 0.604 | 0.24 | 106.12 | 5.58 |
| 1200 | 0.3 | 300 | 0.5 | −0.229 | 0.35 | 112.22 | 24.47 |
| 1200 | 0.4 | 600 | 0.4 | 0.148 | 0.063 | 112.70 | 2.48 |

From Tables 2 and 3 it can be seen that the following discretization parameters allow for a gradient coil design meeting the desired characteristics:

$\sigma_P$=0.6, $\Delta_P$=300 A/m
$\sigma_S$=0.3, $\Delta_S$=600 A/m

Figure 18A:
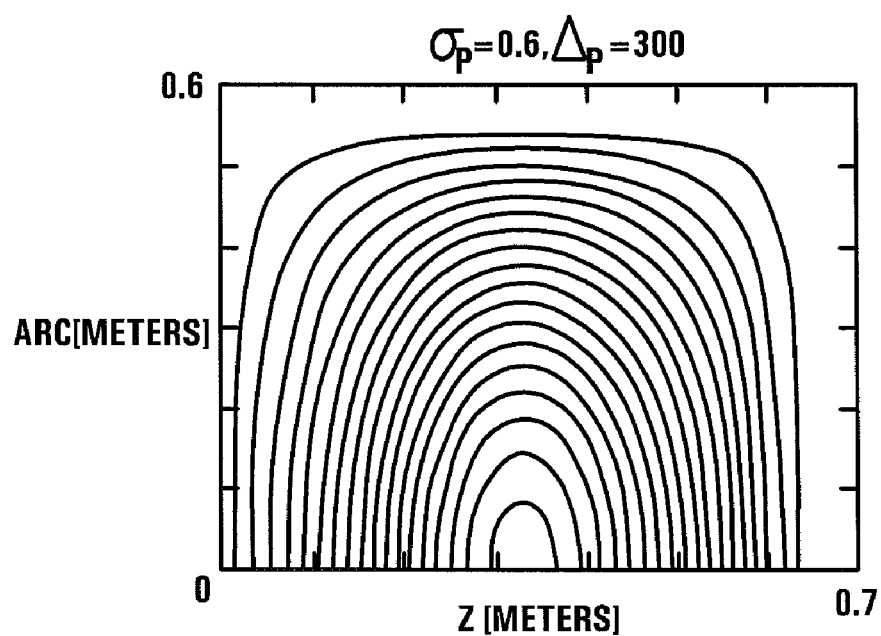
FIG. 18 is a series of graphical illustrations of the current paths on half of a quadrant of the primary coil as shown in FIG. 18a and on half of a quadrant of the shield coil as shown in FIG. 18b of the gradient design using predetermined parameters.
Figure 18B:
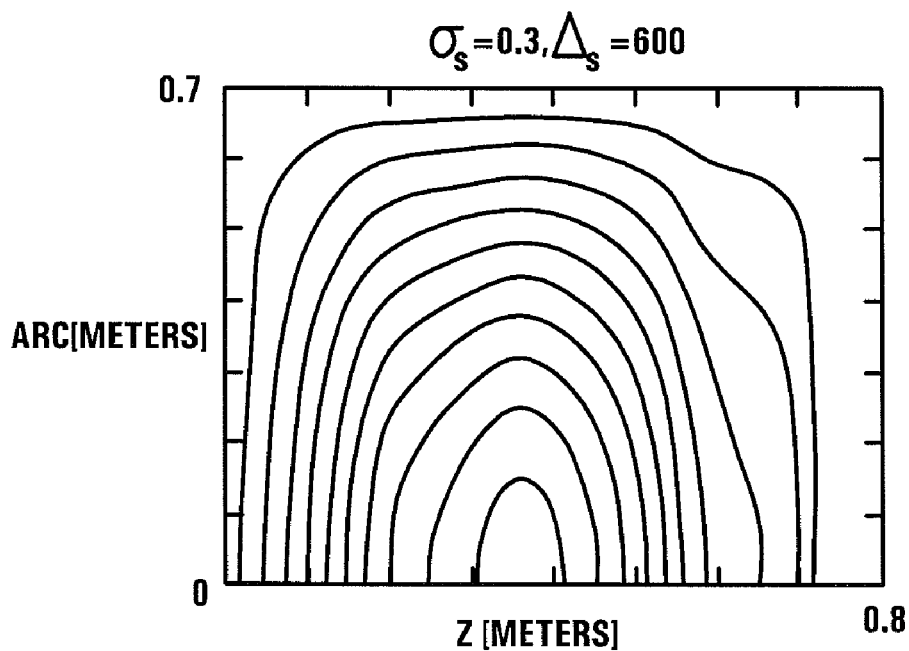
Figure 19:
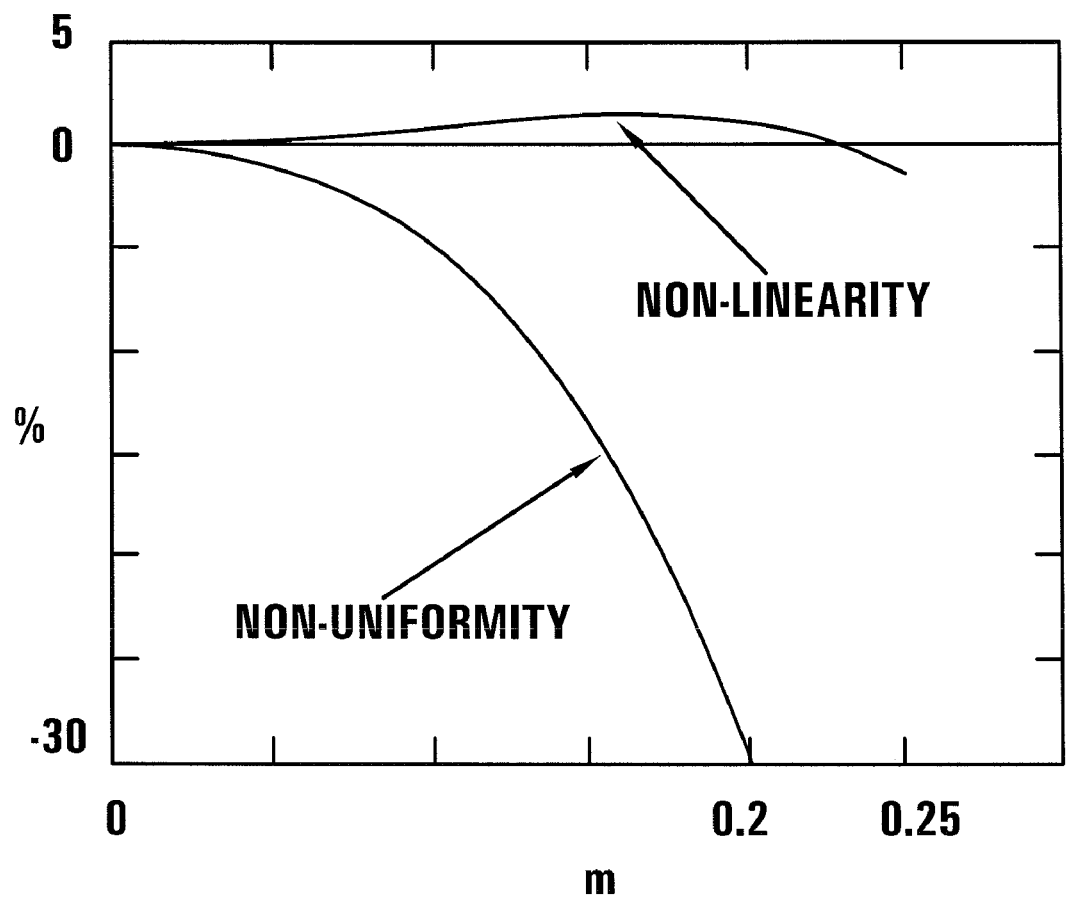
FIG. 19 is a graphical illustration of the field quality characteristics within the 50 cm (x/y)×40 cm (z) FoV of the gradient coil design.

The current paths on half of a quadrant of the primary coil (FIG. 18a) and shield coil (FIG. 18b) of the gradient design using the parameters given in the above example are illustrated in FIGS. 18a and 18b. FIG. 19 illustrates the field quality characteristics within the 50 cm (x/y)×40 cm (z) FoV of the gradient coil design of the above example. Only half of the corresponding volume is illustrated in FIG. 19, as the other half is identical due to the symmetry of the coil design.

The characteristics of the gradient coil design of the above example are shown in Table 4, below.

TABLE 4

Characteristics of Gradient Coil Design of Example

| Property | Value |
|---|---|
| Electrical Length (P/S) [mm] | 1291/1455 |
| Resistance (P/S) [mΩ] | 74.16/36.57 |
| Energy @ G = 30 m T/m | 50.96 |
| Current [A] for G = 30 m T/m | 473.37 |
| Inductance [μH] | 417.70 |
| Slew rate [T/m/s] (losses not included): V = 1200 V, G = 30 m T/m | 174.12 |
| Rise time [sec] (losses not included) | 172.30 |
| DC Dissipated power [kW]: G = 30 m T/m | 24.81 |
| Thrust force on the Gradient Coil [lbs]: G = 30 m T/m | 46.28 |
| Thrust force on the Cold Shield [lbs]: G = 30 m T/m | 10.34 |
| RECE_max [%]/RECE_variation [%] | 0.278/0.199 |
| Global non-linearity max [%] at z = 0.25 m | +3.14 |
| Local non-linearity [%] at z = 0.25 m | −12.2 |
| Non-uniformity [%] at ρ = 0.2 m | −29.45 |

Figure 20:
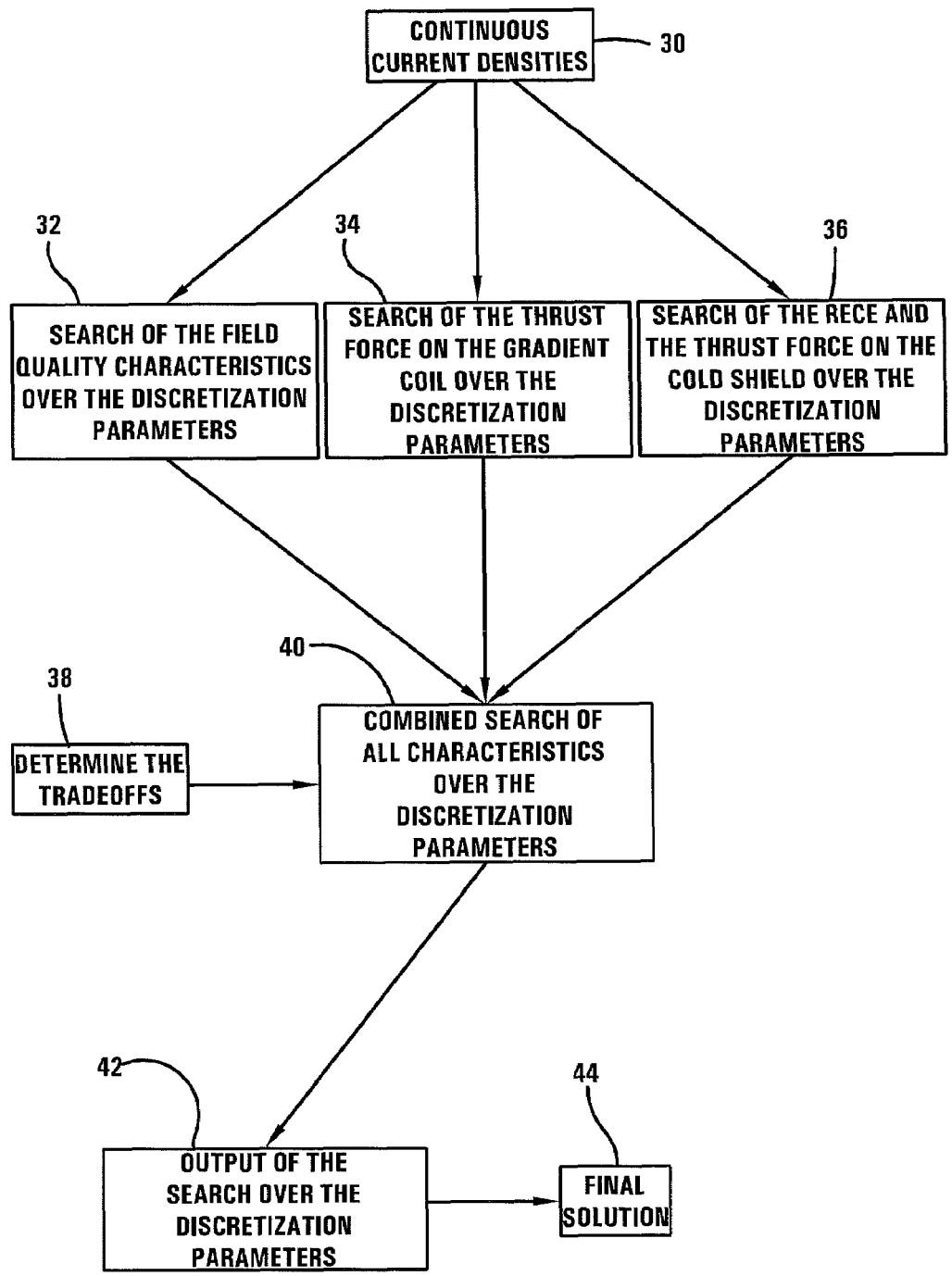
FIG. 20 is a flowchart of the method of this invention as used to design a transverse gradient coil.

A flowchart of an embodiment of the method of this invention as used to design a transverse gradient coil is shown in FIG. 20. As shown in the flowchart of FIG. 20, the discretization parameters are varied, and the field quality characteristics are searched over the range of the varied discretization parameters (see block 32) with consideration of the continuous current densities (see block 30). The thrust force on the gradient coil is searched over the range of the varied discretization parameters (see block 34) with consideration of the continuous current densities (see block 30). The RECE and the thrust force on the cold shield are searched over the range of the varied discretization parameters (see block 36) with consideration of the continuous current densities (see block 30). After these factors have been searched, all other characteristics may be searched over the range of varied discretization parameters (see block 40). The tradeoffs of the design characteristics can then be determined (see block 38). The various design options output by the varied discretization parameters are searched (see block 42) and a final solution is chosen (see block 44).

The present application generally provides a method of designing a gradient coil for use in magnetic resonance imaging (MRI). The method of the various embodiments of the invention can be used to design an axial or a transverse gradient coil. In embodiments of the invention, in designing an axial gradient coil, at least one performance characteristic of the axial gradient coil design is defined. In certain embodiments, the at least one defined performance characteristic may include one or more of the following: at least one field quality characteristic within a field of view, minimum energy, minimum inductance, minimum coil resistance, minimum eddy current effect, minimum eddy current variation over a field of view, minimum net thrust force exerted on the coil, and minimum net thrust force exerted on the cold shield due to eddy currents. Discretization parameters $\sigma_{P,S}$ and current parameter I are concurrently varied within the following two equations:

$$\int_0^{z_n^{(P)}} f_\varphi^{(P)}(z)\,dz - (n - \sigma_P)I = 0 \text{ and}$$

$$\int_0^{z_m^{(S)}} f_\varphi^{(S)}(z)\,dz + (m - \sigma_S)I = 0.$$

Discretization parameters $\sigma_{P,S}$ are varied between 0 and 1. Within the equations, $f_\varphi^{(P,S)}(z)$ is the φ-components of the continuous current density on said primary coil (P) and said shield coil (S), n is an integer between the value of 1 and the number of turns on said primary coil and m is an integer between the value of 1 and the number of turns on said shield coil. Each set of varied discretization parameters and current parameter produces a different hypothetical axial gradient coil design. At least one performance characteristic of each hypothetical axial gradient coil design produced by the varied discretization parameters and the varied current parameter are evaluated. One of the hypothetical axial gradient coil designs is selected. In certain embodiments, the selected design will commonly meet at least one of the defined performance characteristics.

Also described herein is a method of designing an axial gradient coil of further embodiments of the invention, wherein the axial gradient coil having a primary coil and a shield coil for use in magnetic resonance imaging which includes defining at least one performance characteristic of the axial gradient coil, concurrently varying at least two parameters within at least one equation, wherein each result of the varied at least two parameters within the at least on equation produces a different hypothetical axial gradient coil design, evaluating at least one performance characteristic of each hypothetical axial gradient coil design produced by the varied parameters; and selecting one of the hypothetical axial gradient coil designs. Again, in certain embodiments, the at least one defined performance characteristic is selected from the group consisting of at least one field quality characteristic within a field of view, minimum energy, minimum inductance, minimum coil resistance, minimum eddy current effect, minimum eddy current variation over a field of view, minimum net thrust force exerted on the coil, and minimum net thrust force exerted on the cold shield due to eddy currents. In certain embodiments, the selected axial gradient coil design meets the at least one defined performance characteristic.

In designing a transverse gradient coil of further embodiments of the invention, at least one performance characteristic of the transverse gradient coil design is defined. In certain embodiments, the at least one performance characteristic may include one or more of the following: at least one field quality characteristic within a field of view, minimum energy, minimum inductance, minimum coil resistance, minimum eddy current effect, minimum eddy current variation over a field of view, minimum net thrust force exerted on the coil, and minimum net thrust force exerted on the cold shield due to eddy currents. Discretization parameters σ and Δ are concurrently varied within the following equation:

$$S_n = \frac{n-\sigma}{N}(f_z(z_{eye}) - \Delta),$$

wherein the previous equation is used to solve the equation: $\Phi_n(z) = \arccos(S_n/f_z(z))$, which is in turn used to solve the equation: $\phi = \Phi_n(z)$. Discretization parameter σ is varied between the values of 0 and 1. Within the equations, $f_-(z)$ is the z-component of the continuous current density, $Z_{eye}$ is the position where the φ-component of the continuous current density is equal zero, N is the number of loops in one quadrant of the coil, and n is an integer wherein $1 \leq n \leq N$. Each set of varied discretization parameters produces a different hypothetical transverse gradient coil design. At least one performance characteristic of each hypothetical transverse gradient coil design produced by the varied discretization parameters is evaluated. One of the hypothetical transverse gradient coil designs is selected. In certain embodiments, the selected design will commonly meet at least one of the defined performance characteristics.

Also described herein is a method of designing a transverse gradient coil for use in magnetic resonance imaging which includes defining at least one performance characteristic of the transverse gradient coil, concurrently varying at least two parameters within at least one equation wherein each set of varied parameters produces a different hypothetical transverse gradient coil design, evaluating at least one performance characteristic of each hypothetical transverse gradient coil design produced by the varied parameters; and selecting one of the hypothetical transverse gradient coil designs. Again, in certain embodiments, the at least one defined performance characteristic is selected from the group consisting of at least one field quality characteristic within a field of view, minimum energy, minimum inductance, minimum coil resistance, minimum eddy current effect, minimum eddy current variation over a field of view, minimum net thrust force exerted on the coil, and minimum net thrust force exerted on the cold shield due to eddy currents. In further embodiments, the selected transverse gradient coil design meets the at least one defined performance characteristic.

In the foregoing description, certain terms have been used for brevity, clearness, illustration and understanding; but no unnecessary limitations are to be implied therefrom beyond the requirements of the prior art, because such terms are used for descriptive purposes and are intended to be broadly construed. Moreover, this invention has been described in detail with reference to specific embodiments thereof, including the respective best modes for carrying out each embodiment. It shall be understood that these illustrations are by way of example and not by way of limitation.

What is claimed is:

1. A method of designing an axial gradient coil having a primary coil and a shield coil for use in magnetic resonance imaging which comprises:
   a) defining at least one performance characteristic of said axial gradient coil;
   b) concurrently varying discretization parameters $\sigma_{P,S}$ and current parameter I within Equation A and Equation B, wherein $\sigma_{P,S}$ are varied between the values of 0 and 1, wherein Equation A is $$\int_0^{Z_n^{(P)}} f_\varphi^{(P)}(z)\,dz - (n - \sigma_P)I = 0,$$

wherein Equation B is $$\int_0^{Z_m^{(S)}} f_\varphi^{(S)}(z)\,dz + (m - \sigma_S)I = 0$$

and wherein $$f_\varphi^{(P,S)}(z)$$

is the φ-components of the continuous current density on said primary coil (P) and said shield coil (S), n is an integer between the value of 1 and the number of turns on said primary coil and m is an integer between the value of 1 and the number of turns on said shield coil, and wherein each set of varied discretization parameters and current parameter produces different axial gradient coil designs;
   c) evaluating at least one performance characteristic of each different axial gradient coil design produced by the varied discretization parameters and the varied current parameter; and
   d) selecting one of said hypothetical axial gradient coil designs.

2. The method of claim 1 wherein
said at least one defined performance characteristic is selected from the group consisting of at least one field quality characteristic within a field of view, minimum energy, minimum inductance, minimum coil resistance, minimum eddy current effect, minimum eddy current variation over a field of view, minimum net thrust force exerted on the coil, and minimum net thrust force exerted on the cold shield due to eddy currents.

3. The method of claim 1 wherein
said selected axial gradient coil design meets the at least one defined performance characteristic.

4. A method of designing a transverse gradient coil for use in magnetic resonance imaging which comprises:
 a) defining at least one performance characteristic of said transverse gradient coil;
 b) concurrently varying discretization parameters $\sigma$ and $\Delta$ within Equation Z, wherein $\sigma$ is varied between the values of 0 and 1, wherein Equation X is
 $\phi = \Phi_n(z)$,
 wherein Equation Y is
 $\Phi_n(z) = \arccos(S_n / f_z(z))$,
 wherein Equation Z is $$S_n = \frac{n-\sigma}{N}(f_z(z_{eye}) - \Delta)$$

and wherein Equation Z is used to solve Equation Y, and Equation Y is used to solve Equation X, further wherein $f_z(z)$ is the z-component of the continuous current density, $Z_{eye}$ is the position where the $\phi$-component of the continuous current density is equal zero, N is the number of loops in one quadrant of the coil, and n is an integer wherein $1 \leq n \leq N$, and wherein each set of varied discretization parameters produces different transverse gradient coil designs;
 c) evaluating at least one performance characteristic of each different transverse gradient coil design produced by the varied discretization parameters; and
 d) selecting one of said different transverse gradient coil designs.

5. The method of claim 4 wherein
said at least one defined performance characteristic is selected from the group consisting of at least one field quality characteristic within a field of view, minimum energy, minimum inductance, minimum coil resistance, minimum eddy current effect, minimum eddy current variation over a field of view, minimum net thrust force exerted on the coil, and minimum net thrust force exerted on the cold shield due to eddy currents.

6. The method of claim 4 wherein
said selected transverse gradient coil design meets the at least one defined performance characteristic.

* * * * *

UNITED STATES PATENT AND TRADEMARK OFFICE
CERTIFICATE OF CORRECTION

PATENT NO. : 7,482,809 B1  Page 1 of 1
APPLICATION NO. : 11/779445
DATED : January 27, 2009
INVENTOR(S) : Shmaryu Shvartsman It is certified that error appears in the above-identified patent and that said Letters Patent is hereby corrected as shown below:

Claim 1, column 14, line 66, change "hypothetical" to --different--.

Signed and Sealed this

Seventeenth Day of March, 2009

JOHN DOLL
*Acting Director of the United States Patent and Trademark Office*